US011567595B2

(12) United States Patent
Kim et al.

(10) Patent No.: US 11,567,595 B2
(45) Date of Patent: Jan. 31, 2023

(54) DISPLAY DEVICE

(71) Applicant: SAMSUNG DISPLAY CO., LTD., Yongin-si (KR)

(72) Inventors: Ki Cheol Kim, Yongin-si (KR); Min Joo Kim, Yongin-si (KR); Mi Kyung Seo, Yongin-si (KR); Jae Yoon Chang, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/356,985

(22) Filed: Jun. 24, 2021

(65) Prior Publication Data

US 2022/0137738 A1 May 5, 2022

(30) Foreign Application Priority Data

Oct. 29, 2020 (KR) ........................ 10-2020-0142170

(51) Int. Cl.
  *G06F 3/041* (2006.01)
  *H01L 51/52* (2006.01)
  (Continued)

(52) U.S. Cl.
  CPC ........ *G06F 3/0412* (2013.01); *G06F 3/04164* (2019.05); *G09G 3/006* (2013.01);
  (Continued)

(58) Field of Classification Search
  CPC .. G06F 3/0412; G06F 3/04164; G06F 3/0446; G06F 2203/04111; G06F 3/0443; G06F 2203/04103; G09G 3/006; G09G 3/3225; G09G 3/3233; G09G 2300/0426; G09G 2330/04; G09G 2330/12; G09G 2300/0819; G09G 2300/0842; G09G 2300/0861; G09G 2320/0238; H01L 27/3276; H01L 51/5253; H01L 27/3225; H01L 22/32; H01L 27/3246;
  (Continued)

(56) References Cited

U.S. PATENT DOCUMENTS

| 2018/0090517 A1* | 3/2018 | Park .................... H01L 51/5246 |
| 2020/0143722 A1 | 5/2020 | Lee et al. |
| 2020/0194534 A1 | 6/2020 | Park et al. |

FOREIGN PATENT DOCUMENTS

| KR | 10-1587219 | 1/2016 |
| KR | 10-2020-0051099 | 5/2020 |
| KR | 10-2020-0073349 | 6/2020 |

* cited by examiner

*Primary Examiner* — Julie Anne Watko

(74) *Attorney, Agent, or Firm* — F. Chau & Associates, LLC

(57) ABSTRACT

A display device including: a substrate including a display area and a non-display area; a crack sensing line disposed in the non-display area; an electrostatic protecting line disposed in the non-display area; a light emitting element disposed on the substrate and including a first electrode, a second electrode disposed on the first electrode, and an emission layer disposed between the first electrode and the second electrode; and a power supplying line, wherein the second electrode and the power supplying line are in contact in an electrode contact area, the electrode contact area being disposed in the non-display area, and the crack sensing line and the electrostatic protecting line do not overlap the electrode contact area.

19 Claims, 12 Drawing Sheets

(51) Int. Cl.
*H01L 27/32* (2006.01)
*G09G 3/00* (2006.01)
G06F 3/044 (2006.01)
G09G 3/3233 (2016.01)
G09G 3/3225 (2016.01)

(52) U.S. Cl.
CPC ...... *H01L 27/3276* (2013.01); *H01L 51/5253* (2013.01); *G06F 3/0446* (2019.05); *G06F 2203/04111* (2013.01); *G09G 3/3225* (2013.01); *G09G 3/3233* (2013.01); *G09G 2300/0426* (2013.01); *G09G 2330/04* (2013.01); *G09G 2330/12* (2013.01)

(58) Field of Classification Search
CPC ............. H01L 25/0753; H01L 27/1214; H01L 27/323; H01L 51/5246
See application file for complete search history.

DISPLAY DEVICE

CROSS-REFERENCE TO RELATED APPLICATION

This application claims priority under 35 U.S.C. § 119 to Korean Patent Application No. 10-2020-0142170 filed in the Korean Intellectual Property Office on Oct. 29, 2020, the disclosure of which is incorporated by reference herein in its entirety.

TECHNICAL FIELD

The present disclosure relates to a display device.

DESCRIPTION OF THE RELATED ART

A light emitting diode is a semiconductor light source that includes an anode and a cathode and emits light when a current flows from the anode to the cathode. The light emitting diode is durable, and has excellent performance in terms of life-span and luminance.

To install the light emitting diode in a lighting device or a display device, the light emitting diode is connected to an electrode capable of applying power to the light emitting diode. A display device which utilizes light emitting diodes as its primary light source is provided with a plurality of electrodes. However, the arrangement of the electrodes may result in short circuit defects.

SUMMARY

An embodiment of the present disclosure provides a display device including: a substrate including a display area and a non-display area; a crack sensing line disposed in the non-display area; an electrostatic protecting line disposed in the non-display area; a light emitting element disposed on the substrate and including a first electrode, a second electrode disposed on the first electrode, and an emission layer disposed between the first electrode and the second electrode; and a power supplying line, wherein the second electrode and the power supplying line are in contact in an electrode contact area, the electrode contact area being disposed in the non-display area, and the crack sensing line and the electrostatic protecting line do not overlap the electrode contact area.

The display device may further include a sensor electrode disposed in the display area; and a touch sensing line disposed in the non-display area and connected to the sensor electrode, wherein the touch sensing line does not overlap the electrode contact area.

The electrode contact area may be disposed between the crack sensing line and the electrostatic protecting line, in a plan view.

A distance between the electrostatic protecting line and the display area may be larger than a distance between the crack sensing line and the display area.

The display device may further include: a first dam protruding in a display direction of the light emitting element and surrounding a portion of the display area, wherein the electrostatic protecting line is arranged on the first dam.

The electrostatic protecting line may include a first electrostatic protecting line and a second electrostatic protecting line, and the first electrostatic protecting line and the second electrostatic protecting line may overlap each other with an insulating film interposed therebetween.

The display device may further include: a second dam protruding in the display direction of the light emitting element and surrounding the portion of the display area, wherein the first dam is disposed between the display area and the second dam, and a height of the second dam is larger than a height of the first dam.

The crack sensing line may include two layers in a first area, and a single layer in a second area.

The display device may further include: a hole area disposed in the display area, wherein a sensor is disposed in the hole area; and a hole line surrounding a portion of the hole area, wherein the crack sensing line is electrically connected to the hole line.

The hole line may include a first end portion and a second end portion, and the crack sensing line may include: a first crack sensing line disposed on a first side of the display area and including a (1_1)-th crack sensing line for applying a voltage to the first end portion and a (1-2)-th crack sensing line for applying a voltage to the second end portion; and a second crack sensing line disposed on a second side of the display area and including a (2_1)-th crack sensing line for applying a voltage to the first end portion and a (2-2)-th crack sensing line for applying a voltage to the second end portion.

The first electrode may be an anode electrode and the second electrode may be a cathode electrode.

The display device may further include: a first thin film encapsulation layer covering a portion of the second electrode; and a second thin film encapsulation layer covering a portion of the first thin film encapsulation layer.

The display device may further include: a first dam protruding in a display direction of the light emitting element and surrounding a portion of the display area, wherein the second thin film encapsulation layer is disposed in an area surrounded by the first dam, and overlaps the electrode contact area.

A portion of the first thin film encapsulation layer may overlap the electrode contact area, and the second thin film encapsulation layer may not overlap the electrode contact area.

Each of the first thin film encapsulation layer and the second thin film encapsulation layer may at least partially overlap the electrode contact area.

The first thin film encapsulation layer may have a first thickness, and the second thin film encapsulation layer may have a second thickness larger than the first thickness.

The light emitting element may be an organic light emitting diode or a nano-scale light emitting diode.

An embodiment of the present disclosure provides a display device including: a substrate including a display area and a non-display area; a light emitting element disposed in the display area, wherein the light emitting element includes an electrode in the non-display area; an electrostatic protecting line and a crack sensing line disposed in the non-display area; and a power supply line disposed in the non-display area between the electrostatic protecting line and the crack sensing line, wherein the electrode of the light emitting element is connected to the power supply line.

The electrostatic protecting line and the crack sensing line may not overlap an area where the power supply line and the electrode of the light emitting element overlap.

An embodiment of the present disclosure provides a display device including: a substrate including a non-sensing area and a sensing area; a light emitting element disposed in the sensing area and overlapped by a plurality of thin film encapsulation films; a crack sensing line disposed on the plurality of thin film encapsulation films in the non-sensing area; an electrostatic protecting line disposed on a dam in the non-sensing area; and a power supply line disposed in the non-sensing area and connected with the light emitting element, wherein a connection point between the power supply line and the light emitting element is not overlapped by the light emitting element or the crack sensing line.

DETAILED DESCRIPTION OF THE EMBODIMENTS

Figure 1:
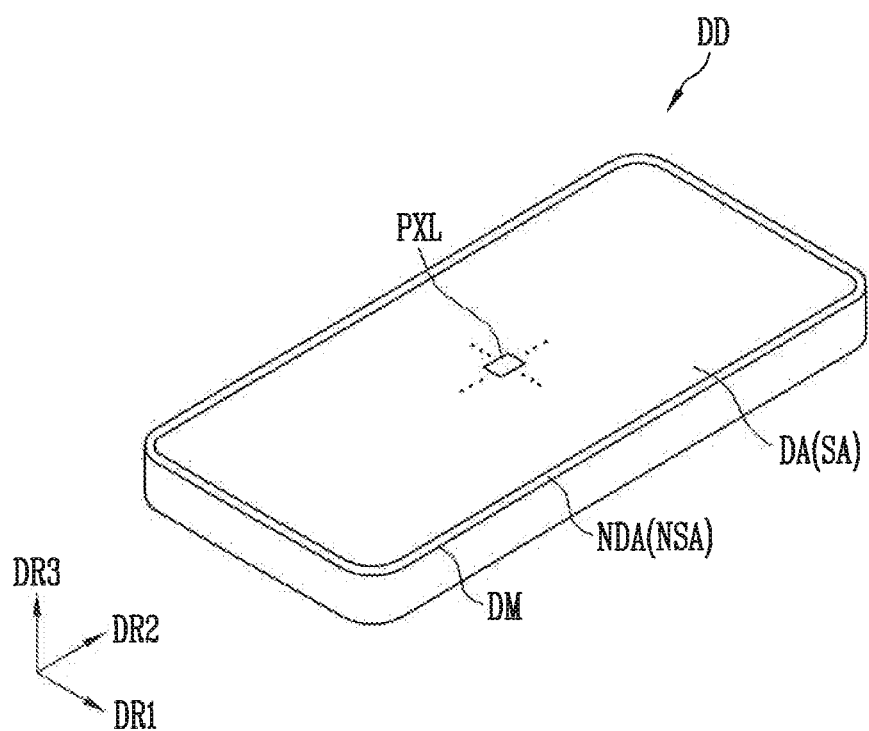
FIG. 1 illustrates a perspective view of a display device according to an embodiment of the present disclosure.

Hereinafter, embodiments of the present disclosure will be illustrated in the drawings and described in detail in the written description. However, the present disclosure is not limited to the embodiments described herein. For example, the present disclosure may be embodied in many different forms.

Like reference numerals may refer to like parts throughout the accompanying drawings, and the sizes and shapes of elements shown in the drawings may be exaggerated to aid understanding of the present invention.

In addition, the embodiments of the present disclosure described herein may be implemented separately or in combination with each other.

Hereinafter, a display device according to embodiments of the present disclosure will be described with reference to FIG. 1 to FIG. 13.

FIG. 1 illustrates a perspective view of a display device according to an embodiment of the present disclosure.

A display device DD is a device that may provide visual data to a user. The display device DD may include a light emitting element capable of emitting light when an electrical signal is applied thereto. For example, the display device DD may be a tablet personal computer (PC), a television, a smart phone, or a laptop computer, but is not limited thereto.

The display device DD may include a display module DM, a display area DA, a non-display area NDA, a sensing area SA, a non-sensing area NSA, and a pixel PXL.

The display module DM may display a video and/or and an image through the display area DA. The display module DM may sense a touch input applied by a user through the sensing area SA or sense incident light.

At least a portion of the display area DA may correspond to the sensing area SA. At least a portion of the non-display area NDA may correspond to the non-sensing area NSA.

The display module DM may output visual information on a front surface of the display device DD. The display module DM may include at least one or more pixels PXL. The pixels PXL may be disposed within the display area DA. An individual pixel PXL may include a light emitting element (see 'LD' in FIG. 4). The light emitting element LD may emit light in a display direction (for example, a third direction DR3).

Light may be emitted in the third direction DR3 in the display area DA. The display area DA may be an area in which visual data is displayed to the outside. The display area DA may be an area in which the pixels PXL are disposed. The non-display area NDA may be an area in which the pixels PXL are not disposed. For example, circuitry for driving the pixels PXL may be provided in the non-display area NDA or beneath the display module DM. The display area DA and the non-display area NDA may not overlap in a plan view. For example, the non-display area NDA may surround the display area DA, but is not limited thereto.

The sensing area SA may receive a touch input provided from the outside. The non-sensing area NSA may be an area to which a touch input provided from the outside may not be applied. In other words, the non-sensing area NSA may not sense a touch provided thereto. The sensing area SA and the non-sensing area NSA may not overlap in a plan view. For example, the non-sensing area NSA may surround the sensing area SA, but is not limited thereto.

Figure 2:
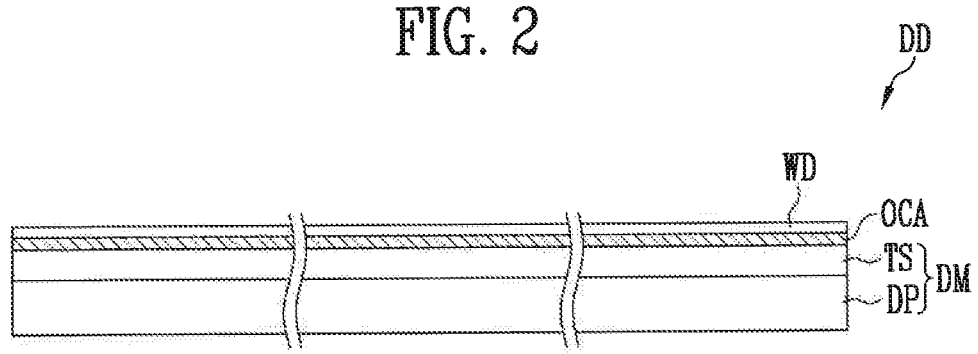
FIG. 2 illustrates a cross-sectional view of a display device according to an embodiment of the present disclosure.

FIG. 2 illustrates a cross-sectional view of a display device according to an embodiment of the present disclosure.

Referring to FIG. 2, the display device DD may include a display module DM, an optical clear adhesive member OCA, and a window WD. The display module DM may include a display panel DP and a touch sensor TS.

The display panel DP may output visual data. As the display panel DP, a self-emission display panel such as an organic light emitting display panel (OLED panel) using an organic light emitting diode as a light emitting element, a nano-scale LED display panel using an ultra small light emitting diode as a light emitting element, or a quantum dot organic light emitting display panel (QD OLED panel) using a quantum dot and an organic light emitting diode may be used. However, the display panel DP is not limited to the above-described examples, and the display panel DP may be at least one of a liquid crystal display (LCD) panel, an electro-phoretic display (EPD) panel, and an electro-wetting display (EWD) panel.

Hereinafter, for convenience, a case in which the light emitting element LD included in the display device DD is an organic light emitting diode will be mainly described.

The touch sensor TS may be disposed on the display panel DP. For example, a bottom surface of the touch sensor TS may contact an upper surface of the display panel DP. The touch sensor TS may be disposed within the sensing area SA.

When a touch input is applied from a user, the touch sensor TS may obtain information on the touch input. For example, the touch sensor TS may obtain coordinate information of the touch input. The touch sensor TS may recognize the touch input by using a capacitive sensing method. Alternatively, the touch sensor TS may sense the touch input by using a mutual capacitance method, or may sense the touch input by using a self-capacitance method.

The window WD may be disposed on the display module DM, The window WD may be a transparent light-transmitting substrate. The window WD and the display module DM may be bonded to each other by the optical clear adhesive member OCA. The window WD may transmit visual information and reduce an external impact on the display device DD.

Figure 3:
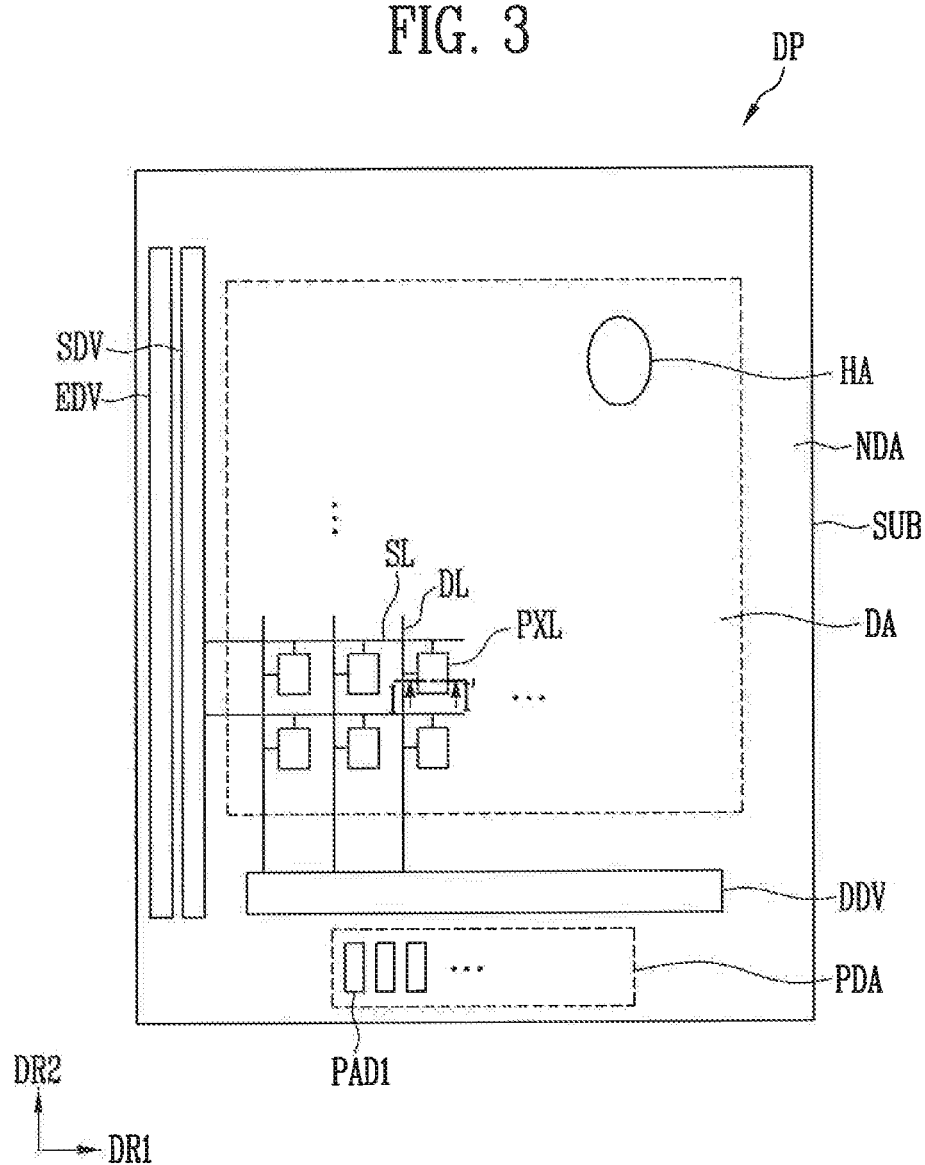
FIG. 3 illustrates a schematic top plan view of a display device according to an embodiment of the present disclosure.

FIG. 3 illustrates a schematic top plan view of a display device according to an embodiment of the present disclosure.

Referring to FIG. 3, the display panel DP may include a substrate SUB, a pixel PXL, a scan driver SDV, a light emission driver EDV, a data driver DDV, a wire part, a hole area HA, and a pad area PDA.

The substrate SUB may include the display area DA and the non-display area NDA. The pixel PXL may be disposed on the substrate SUB in the display area DA. The pixels PXL may be arranged in a matrix format according to a row extending along a first direction DR1 and a column extending along a second direction DR2. For example, a plurality of pixels PXL may be arranged in rows and columns in the display area DA. The scan driver SDV, the light emission driver EDV, the data driver DDV, and the wire part may be disposed within the non-display area NDA. The hole area HA may be disposed within the display area DA. However, the hole area HA is not limited to the above-described example. For example, in some embodiments of the present disclosure, the hole area HA may be disposed within the non-display area NDA.

Each of the scan driver SDV, the light emission driver EDV, and the data driver DDV may output electrical information that may be provided to the pixel PXL.

The scan driver SDV may transmit a scan signal to the pixel PXL along a scan line SL, The light emission driver EDV may provide a light emission control signal to the pixel PXL along a light emission control line. The data driver DDV may provide a data signal to the pixel PXL along a data line DL. Each of the scan line SL, light emission control line and data line DL may be provided in plural.

The wire part may be disposed within the non-display area NDA. The wire part may be electrically connected to at least one of the scan driver SDV, the light emission driver EDV, the data driver DDV, and the pixel PXL.

The hole area HA may be disposed within the display area DA. The hole area HA may be an area in which a hole formed by punching a structure stacked on the substrate SUB. The hole area HA may be an area in which a proximity sensor, an illuminance sensor, an iris sensor, an infrared sensor, an ultrasonic wave sensor, and a camera device, as a panel lower sensor, may be disposed, but is not limited thereto. The pixels PXL may be disposed around the hole area HA and not within the hole area HA.

The pad area PDA may be disposed within the display area DA. The pad area FDA may also be disposed in the non-display area NDA. The pad area PDA may be disposed at a lower end portion of the display panel DP. A first pad PAD1 may be included in the pad area PDA. In this case, the first pad PAD1 may be a display pad electrically connected to the pixel PXL.

Figure 4:
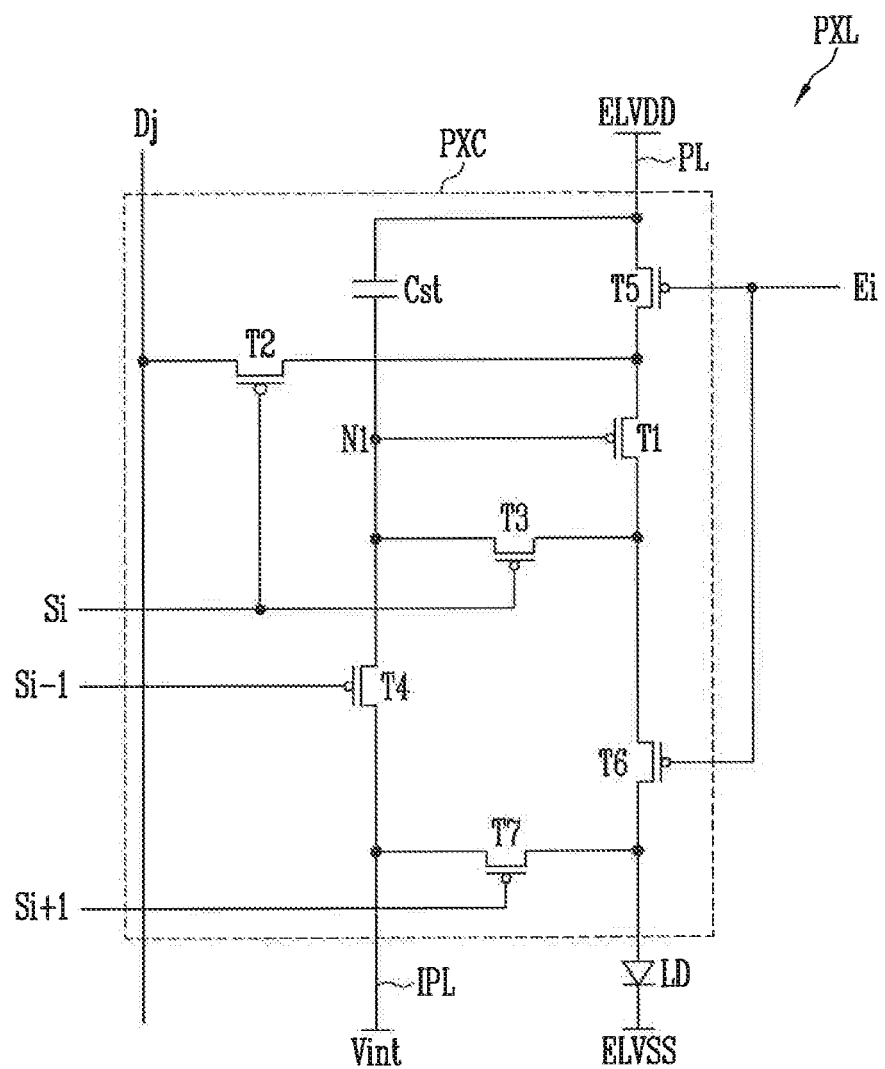
FIG. 4 illustrates a pixel driving circuit of a pixel according to an embodiment of the present disclosure.

FIG. 4 illustrates a pixel driving circuit of a pixel according to an embodiment of the present disclosure.

The pixel PXL may include a pixel driving circuit PXC. The pixel driving circuit PXC may include first to seventh transistors T1 to T7 and a storage capacitor Cst. The pixel driving circuit PXC may be electrically connected to the light emitting element LD.

A first electrode of the first transistor T1 may be connected to a first power source ELVDD via the fifth transistor T5, and a second electrode of the first transistor T1 may be connected to an anode electrode of the light emitting element LD via the sixth transistor T6. The first transistor T1 may control an amount of current flowing from the first power source ELVDD via the light emitting element LD to a second power source ELVSS based on a voltage of a first node N1. The first node N1 may be connected to a gate electrode of the first transistor T1. The first transistor T1 may be a driving transistor.

The second transistor T2 may be connected between the first electrode of the first transistor T1 and a j-th data line Dj. A gate electrode of the second transistor T2 may be connected to an i-th scan line Si. When a scan signal is applied from the i-th scan line Si, the second transistor T2 may be turned on to electrically connect the j-th data line Dj and the first electrode of the first transistor T1. For example, a data voltage of the j-th data line Dj may be applied to the first electrode of the first transistor T1. The second transistor T2 may be a switching transistor.

The third transistor T3 may be connected between the second electrode of the first transistor T1 and the first node N1. When a scan signal of a gate-on voltage is applied from the i-th scan line Si, the third transistor T3 may be turned on to electrically connect the second electrode of the first transistor T1 to the first node N1.

The fourth transistor T4 may be connected between the first node N1 and an initialization power line IPL to which an initialization power source Vint is applied. A gate electrode of the fourth transistor T4 may be connected to an (i−1)-th scan line Si−1. When a scan signal is applied to the (i−1)-th scan line Si−1, the fourth transistor T4 may be turned on to supply a voltage of the initialization power source Vint to the first node N1. The fourth transistor T4 may be an initialization transistor.

The fifth transistor T5 may be connected between the power line PL to which the first power source ELVDD is applied and the first transistor T1. For example, the fifth transistor T5 may be connected to the first electrode of the first transistor T1. A gate electrode of the fifth transistor T5 may be connected to an i-th emission control line Ei. When a light emission control signal (for example, a high level voltage) of a gate-off voltage is applied from the i-th light emission control line Ei, the fifth transistor T5 may be turned off, otherwise, the fifth transistor T5 may be turned on.

The sixth transistor T6 may be connected between the first transistor T1 and the light emitting element LD. For example, the sixth transistor T6 may be connected to the second electrode of the first transistor T1. A gate electrode of the sixth transistor T6 may be connected to the i-th emission control line Ei. When an emission control signal of a gate-off voltage is applied from the i-th emission control line Ei, the sixth transistor T6 may be turned off, otherwise, the sixth transistor T6 may be turned on.

The seventh transistor T7 may be connected between the initialization power line IPL and the anode electrode of the light emitting element LD. A gate electrode of the seventh transistor T7 may be connected to an (i+1)-th scan line Si+1. When a scan signal of a gate-on voltage (for example, a low level voltage) is applied from the (i+1)-th scan line Si+1, the seventh transistor T7 may be turned on to supply a voltage of the initialization power source Vint to the anode electrode of the light emitting element LD. In FIG. 4, the gate electrode of the seventh transistor T7 is connected to the (i+1)-th scan line Si+1, but the present disclosure is not limited thereto. For example, the gate electrode of the seventh transistor T7 may be connected to the i-th scan line Si. In this case, the seventh transistor T7 is turned on by the scan signal of the gate-on voltage applied from the i-th scan line Si.

The voltage of the initialization power source Vint may be set to a voltage lower than that of the data signal. For example, the voltage of the initialization power source Vint may be set to be less than or equal to a lowest voltage of the data signal. In other words, the voltage of the initialization power source Vint may be lower than the data voltage.

The storage capacitor Cst may be connected between the power line PL to which the first power source ELVDD is applied and the first node N1. The storage capacitor Cst may store information on a voltage corresponding to the data signal (e.g., the data voltage) and a threshold voltage of the first transistor T1.

The anode electrode of the light emitting element LD may be connected to the first transistor T1 via the sixth transistor T6. A cathode electrode of the light emitting element LD may be connected to the second power supply source ELVSS.

The light emitting element LD may emit light having a predetermined luminance corresponding to an amount of current supplied from the first transistor T1. A voltage value of the first power supply source ELVDD may be set to be higher than that of the second power supply source ELVSS so that a current flows through the light emitting element LD.

In FIG. 4, it is illustrated that the pixel PXL includes a single light emitting element LD, but in another embodiment, the pixel PXL may include a plurality of light emitting elements LD, and the plurality of light emitting elements LD may be connected in series, in parallel, or in series/parallel to each other.

Additionally, in FIG. 4, it is described that the pixel PXL is driven by using the signals of the i-th scan line Si, the (i−1)-th scan line Si−1, and the (i+1)-th scan line Si+1, but the present disclosure is not limited thereto. For example, the i-th scan line Si, the (i−1)-th scan line Si−1, and the (i+1)-th scan line Si+1 may be separate signal lines that receive scan signals from different scan drivers.

Figure 5:
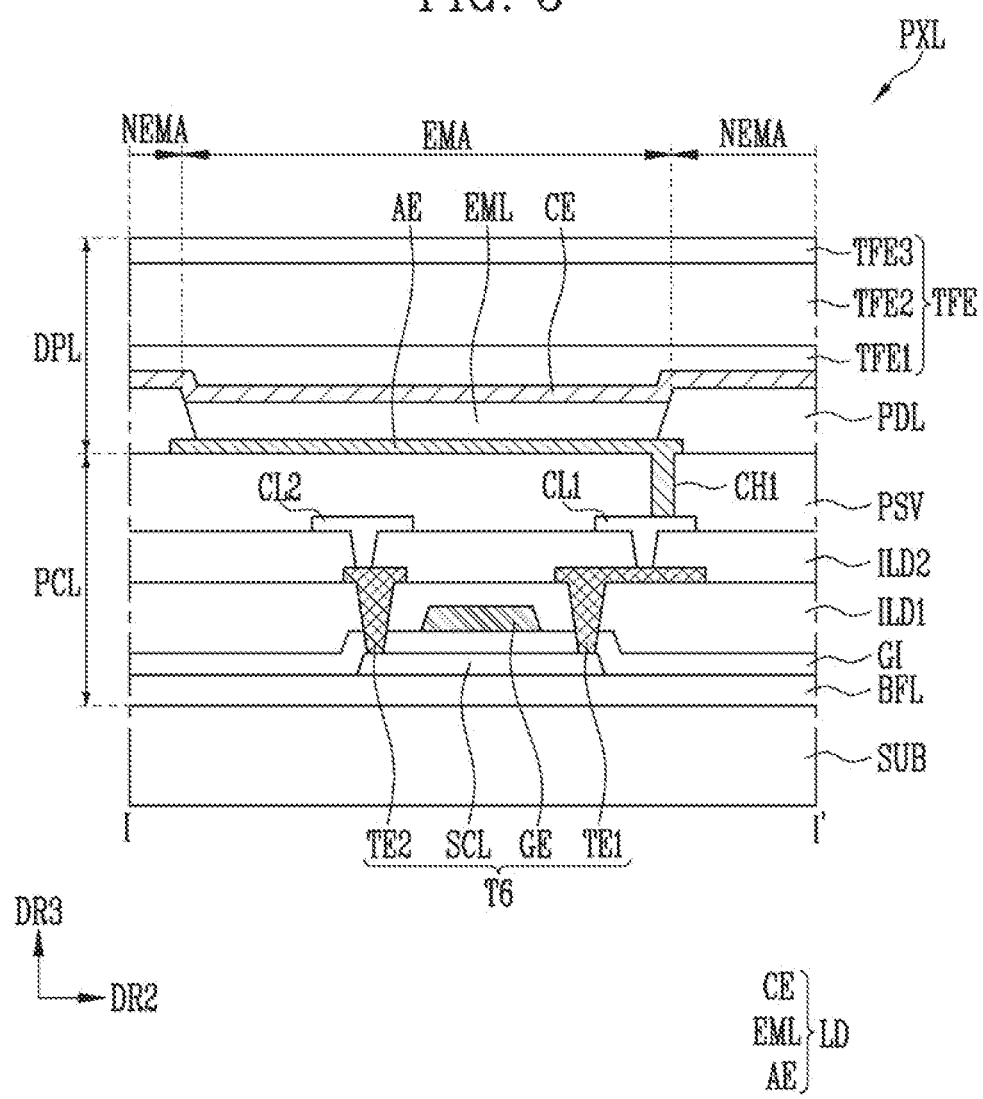
FIG. 5 illustrates a cross-sectional view taken along line I-I' of FIG. 3.

FIG. 5 illustrates a cross-sectional view taken along line of FIG. 3. In FIG. 5, for better understanding and ease of description, only a cross-section of a portion corresponding to the sixth transistor T6 among the first to seventh transistors T1 to T7 shown in FIG. 4 is shown.

The pixel PXL may include the substrate SUB, a pixel circuit part PCL, and a display element part DPL.

The substrate SUB may include a rigid material or a flexible material. According to the present embodiment, the flexible material may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, cellulose triacetate, and cellulose acetate propionate. However, the material of the substrate SUB is not limited to a specific example.

The pixel circuit part PCL may be disposed on the substrate SUB. The pixel circuit part PCL may include a buffer film BFL, a gate insulating film GI, the sixth transistor T6, a first interlayer insulating film ILD1, a second interlayer insulating film ILD2, a first conductive line CL1, a second conductive line CL2, a first contact hole CH1, and a passivation film PSV.

The buffer film BFL may be disposed on the substrate SUB. The buffer film BFL may prevent diffusion of impurities to the sixth transistor T6.

The buffer film BFL may include at least one of metal oxides such as a silicon nitride (SiNx), a silicon oxide (SiOx), a silicon oxynitride (SiOxNy), and an aluminum oxide (AlOx). However, in some embodiments, the buffer film BFL may be omitted.

The sixth transistor T6 may include a semiconductor pattern SCL, a first transistor electrode TE1, a second transistor electrode TE2, and a gate electrode GE.

The semiconductor pattern SCL may be disposed on the buffer film BFL. The semiconductor pattern SCL may be a semiconductor layer. According to the present embodiment, the semiconductor pattern SCL may include at least one of polysilicon, amorphous silicon, and an oxide semiconductor.

The semiconductor pattern SCL may include a first contact area in contact with the first transistor electrode TE1 and a second contact area in contact with the second transistor electrode TE2. The first contact area and the second contact area may be a semiconductor pattern doped with an impurity. The first contact area and the second contact area may be separated from each other. A region between the first contact region and the second contact region may be a channel region. The channel region may be an intrinsic semiconductor pattern in which no impurity is doped.

The gate insulating film GI may be disposed on the semiconductor pattern SCL. The gate insulating film GI may include an inorganic material. According to the present embodiment, the gate insulating film GI may include at least one of a silicon nitride (SiNx), a silicon oxide (SiOx), a silicon oxynitride (SiOxNy), and an aluminum oxide (AlOx). In some embodiments, the gate insulating film GI may include an organic material.

The gate electrode GE may be disposed on the gate insulating film GI. A position of the gate electrode GE may correspond to a position of the channel region of the semiconductor pattern SCL. For example, the gate electrode GE may be disposed on the channel region of the semiconductor pattern SCL with the gate insulating film GI interposed therebetween.

The first interlayer insulating film ILD1 may be disposed on the gate electrode GE. The first interlayer insulating film ILD1 may include at least one of a silicon nitride (SiNx), a silicon oxide (SiOx), a silicon oxynitride (SiOxNy), and an aluminum oxide (AlOx).

The first transistor electrode TE1 and the second transistor electrode TE2 may be disposed on the first interlayer insulating film ILD1. The first transistor electrode TE1 may pass through the gate insulating film GI and the first interlayer insulating film ILD1 to contact the first contact region of the semiconductor pattern SCL. The second transistor electrode TE2 may pass through the gate insulating film GI and the first interlayer insulating film ILD1 to contact the second contact region of the semiconductor pattern SCL. According to the present embodiment, the first transistor electrode TE1 may be a drain electrode, and the second transistor electrode TE2 may be a source electrode.

The second interlayer insulating film ILD2 may be disposed on the first transistor electrode TE1 and the second transistor electrode TE2. The second interlayer insulating film ILD2 may include an inorganic material. According to the present embodiment, the second interlayer insulating film ILD2 may include at least one of a silicon nitride (SiNx), a silicon oxide (SiOx), a silicon oxynitride (SiOxNy), and an aluminum oxide (AlOx). In some embodiments, the second interlayer insulating film ILD2 may include an organic material.

The first conductive line CL1 is disposed on the second interlayer insulating film ILD2, and may be electrically connected to the first transistor electrode TE1 through a contact hole passing through the second interlayer insulating film ILD2.

The second conductive line CL2 is disposed on the second interlayer insulating film ILD2, and may be electrically connected to the second transistor electrode TE2 through a contact hole passing through the second interlayer insulating film ILD2.

The first conductive line CL1 and the second conductive line CL2 may be paths through which an electrical signal may flow. The first conductive line CL1 may be a bridge electrode electrically connecting the sixth transistor T6 and the display element part DPL. According to the present embodiment, each of the first conductive line CL1 and the second conductive line CL2 may include at least one of molybdenum (Mo), tungsten (W), aluminum-neodymium (AlNd), titanium (Ti), aluminum (Al), and silver (Ag).

The passivation film PSV may be disposed on the second interlayer insulating film ILD2. The passivation film PSV may cover the first conductive line CL1 and the second conductive line CL2. The passivation film PSV may include an organic material or an inorganic material. The passivation film PSV may include the first contact hole CH1 exposing one area of the first conductive line CL1. The exposed area of the first conductive line CL1 may be coupled to the display element part DPL.

The display element part DPL may include a pixel defining film (or layer) PDL, a light emitting element LD, and a thin film encapsulation film TFE.

The pixel defining film PDL may define a position in which the light emitting element LD is arranged. The pixel defining film PDL may include an organic material. According to the present embodiment, the pixel defining film PDL may include at least one of an acryl resin, an epoxy resin, a phenolic resin, a polyamide resin, and a polyimide resin.

The light emitting element LD may include a first electrode AE, an emission layer EML, and a second electrode CE. The light emitting element LD may be disposed on the passivation film PSV in the display area DA.

One of the first electrode AE and the second electrode CE may be an anode electrode, and the other thereof may be a cathode electrode. According to the present embodiment, when the light emitting element LD is a top light emitting type of organic light emitting diode, the first electrode AE may be a reflective electrode, and the second electrode CE may be a transmissive electrode. Hereinafter, a case in which the light emitting element LD is a top light emitting type organic light emitting diode OLED, and thus, the first electrode AE is an anode electrode, and the second electrode CE is a cathode electrode, will be mainly described.

The first electrode AE may be disposed on the passivation film PSV in the display area DA. The first electrode AE may be electrically connected to the first conductive line CL1 through the first contact hole CH1. In other words, the first electrode AE may be connected to the bridge electrode to be electrically connected with the sixth transistor T6. The first electrode AE may include a reflective film capable of reflecting light or a transparent conductive film disposed above or below the reflective film. For example, the first electrode AE may be formed as a multi-film including a lower transparent conductive film made of an indium tin oxide (ITO), a reflective film provided on the lower transparent conductive film and made of Ag, and an upper transparent conductive film provided on the reflective film and made of an indium tin oxide (ITO).

The emission layer EML may be disposed in an area defined by the pixel defining film PDL. The emission layer EML may define a light emitting area EMA in which light may be emitted. The emission layer EML of the light emitting element LD may be disposed in the light emitting area EMA. The emission layer EML of the light emitting element LD may not be disposed in a non-light emitting area NEMA. The non-light emitting area NEMA may overlap the pixel defining film PDL.

The emission layer EML may include an organic material. The emission layer EML may have a multi-layered thin film structure including a light generation layer. The emission layer EML may include a hole injection layer for injecting holes, a hole transport layer for increasing recombination between holes and electrons, a light generation layer that emits light by recombination of injected electrons and holes, a hole blocking layer for blocking movement of holes that are not combined in the light generation layer, an electron transport layer for smoothly transporting electrons to the light generation layer, and an electron injection layer for injecting electrons.

When an electrical signal is applied to the emission layer EML, light may be emitted. A color of light generated by the emission layer EML may be one of red, green, blue, and white, but is not limited thereto. For example, the color of light generated by the emission layer EML may be one of magenta, cyan, and yellow.

The second electrode CE may be disposed on the emission layer EML. The second electrode CE may be provided in a plate shape on the display area DA, but is not limited thereto. In addition, at least a portion of the second electrode CE may be disposed in the non-display area NDA. For example, the second electrode CE may overlap the pixel defining film PDL in the non-display area NEMA. Further about the arrangement of the second electrode CE will be described later with reference to FIG. 12 and FIG. 13.

The second electrode CE may include a transparent conductive material such as one transparent conductive oxide of an indium tin oxide (ITO), an indium zinc oxide (IZO), an aluminum zinc oxide (AZO), a gallium doped zinc oxide (GZO), a zinc tin oxide (ZTO), a gallium tin oxide (GTO), and a fluorine doped tin oxide (FTO). In some embodiments, when the light emitting element LD is a rear (or bottom) light emitting type organic light emitting diode, the second electrode CE may include a translucent conductive material such as magnesium (Mg), silver (Ag), or an alloy of magnesium (Mg) and silver (Ag).

The thin film encapsulation film TFE may be disposed on the second electrode CE. The thin film encapsulation film TFE may include a plurality of insulating films covering the light emitting element LD.

As an example, the thin film encapsulation film TFE may include a first thin film encapsulation film TFE1, a second thin film encapsulation film TFE2, and a third thin film encapsulation film TFE3. Each of the first thin film encapsulation film TFE1, the second thin film encapsulation film TFE2, and the third thin film encapsulation film TFE3 may include an inorganic material or an organic material. According to the present embodiment, the first thin film encapsulation film TFE1 may include an inorganic material, the second thin film encapsulation film TFE2 may include an organic material, and the third thin film encapsulation film TFE3 may include an inorganic material, and accordingly, the thin film encapsulation film TFE may have a structure in which inorganic and organic layers are alternately stacked. For example, the first thin film encapsulation film TFE1, the second thin film encapsulation film TFE2, and the third thin film encapsulation film TFE3 may be sequentially stacked.

Figure 6:
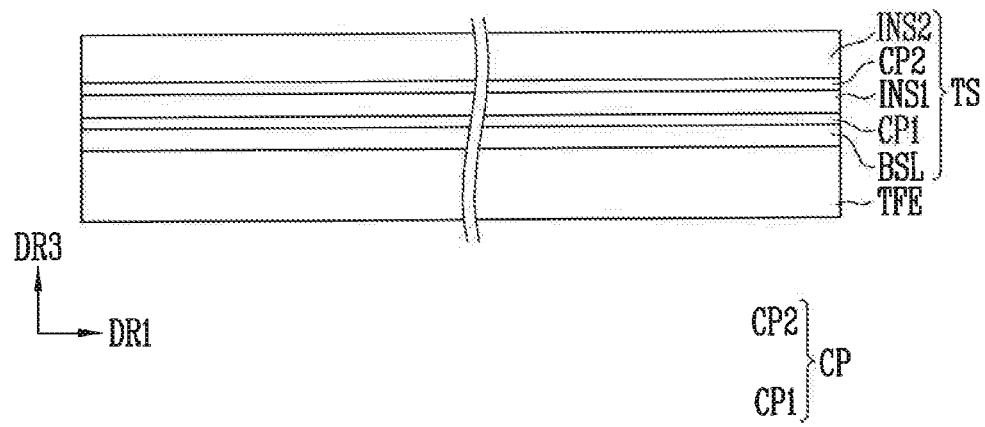
FIG. 6 illustrates a cross-sectional view of a touch sensor according to an embodiment of the present disclosure.

FIG. 6 illustrates a cross-sectional view of a structure of a touch sensor according to an embodiment of the present disclosure.

Referring to FIG. 6, the touch sensor TS may include a base layer BSL, a conductive pattern CP, a first insulating layer INS1, and a second insulating layer INS2. The conductive pattern CP may include a first conductive pattern CP1 and a second conductive pattern CP2. The first insulating layer INS1 may be disposed between the first conductive pattern CP1 and the second conductive pattern CP2.

The base layer BSL may be disposed on the thin film encapsulation film TFE. The base layer BSL may be a base surface of the touch sensor TS. The base layer BSL may include an insulating film. However, the base layer BSL may be omitted according to embodiments of the present disclosure. In this case, the first conductive pattern CP1 may be disposed on the thin film encapsulation film TFE.

The first conductive pattern CP1 may be disposed on the base layer BSL. The second conductive pattern CP2 may be disposed on the first insulating layer INS1. The first insulating layer INS1 may be interposed between the first conductive pattern CP1 and the second conductive pattern CP2. The second insulating layer INS2 may be disposed on the second conductive pattern CP2.

The first conductive pattern CP1 and/or the second conductive pattern CP2 may be implemented as a single layer. In this case, the first conductive pattern CP1 and/or the second conductive pattern CP2 may include a metal layer or a transparent conductive layer. For example, the metal layer may include molybdenum, silver, titanium, copper, aluminum, and an alloy thereof. The transparent conductive layer may include a transparent conductive oxide such as an indium tin oxide (ITO), an indium zinc oxide (IZO), a zinc oxide (ZnO), and an indium tin zinc oxide (ITZO). In addition, the transparent conductive layer may include PEDOT, a metal nano wire, and/or graphene.

Alternatively, the first conductive pattern CP1 and/or the second conductive pattern CP2 may be implemented as a multilayer. In this case, the first conductive pattern CP1 and/or the second conductive pattern CP2 may include a multi-layered metal layer. For example, the multi-layered metal layer may have a three-layered structure of titanium/aluminum/titanium.

The first insulating layer INS1 and the second insulating layer INS2 may each include an inorganic material or an organic material. For example, the inorganic material may include one of a silicon nitride (SiNx), a silicon oxide (SiOx), a silicon oxynitride (SiOxNy), an aluminum oxide (AlOx), a zirconium oxide (ZrOx), and a hafnium oxide (HfOx). The organic material may include at least one of an acryl-based resin, a methacrylic-based resin, a polyisoprene, a vinyl-based resin, an epoxy-based resin, a urethane-based resin, a cellulose-based resin, a siloxane-based resin, a polyimide-based resin, a polyamide-based resin, and a perylene-based resin. The second insulating layer INS2 may protect the first conductive pattern CP1 and the second conductive pattern CP2 from external influences. The second insulating layer INS2 may have fluidity, and may have a flat lower structure.

Figure 7:
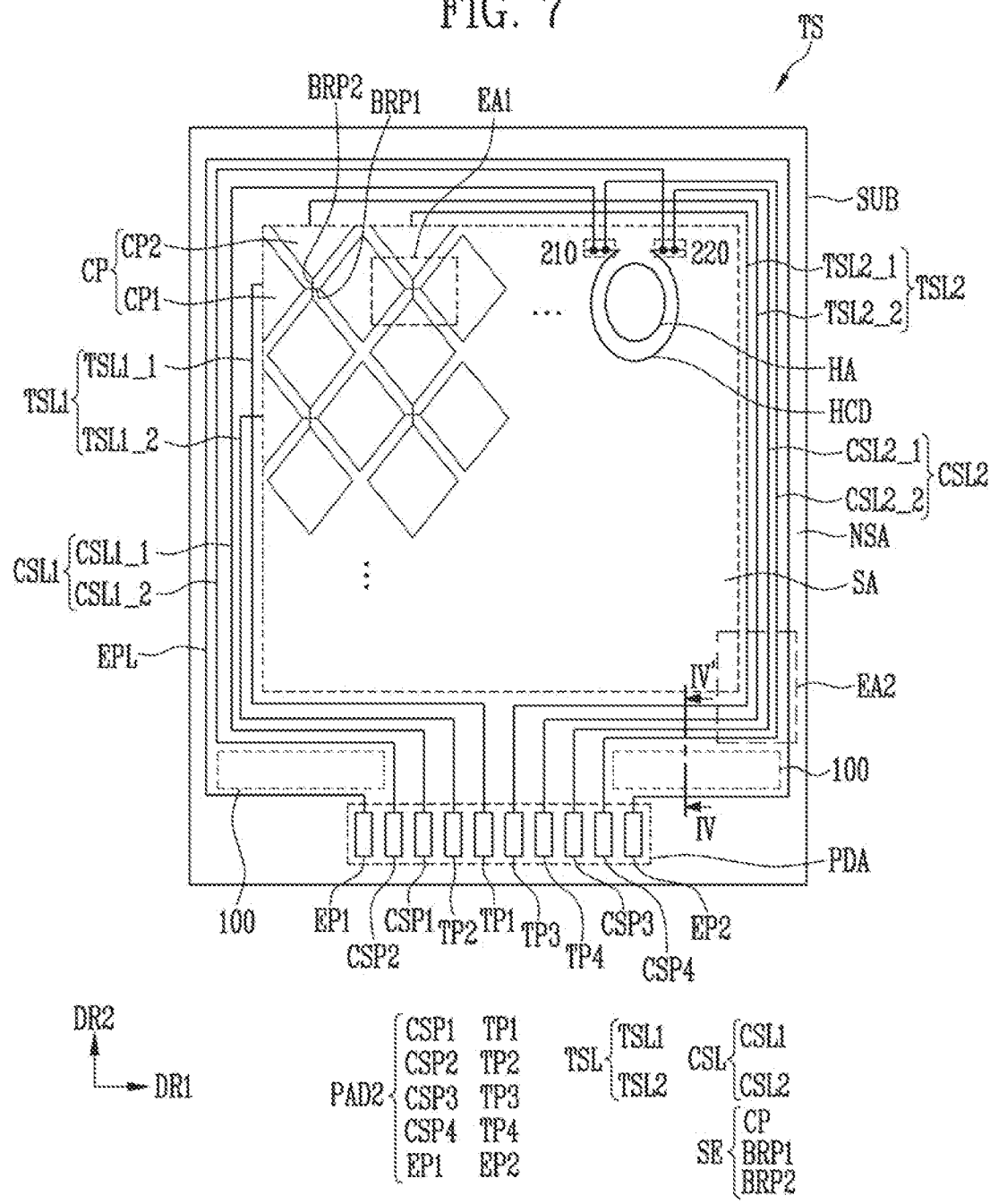
FIG. 7 illustrates a top plan view of a touch sensor according to an embodiment of the present disclosure.

FIG. 7 illustrates a top plan view of a touch sensor according to an embodiment of the present disclosure.

Referring to FIG. 7, the touch sensor TS may include a touch sensing line TSL, a crack sensing line CSL, an electrostatic protecting line EPL, a sensor electrode SE, and a second pad PAD2.

The touch sensor TS may be disposed on the substrate SUB, and the substrate SUB may include a sensing area SA, a non-sensing area NSA, a pad area PDA, a hole area HA, and an electrode contact area 100.

The sensing area SA may at least partially overlap the display area DA of the display panel DP. The sensor electrode SE capable of receiving a touch input may be disposed in the sensing area SA.

The non-sensing area NSA may overlap at least a portion of the non-display area NDA of the display panel DP. The non-sensing area NSA may be disposed in an edge area of the substrate SUB. For example, the non-sensing area NSA may be disposed at opposite edges of the substrate SUB.

The electrode contact area 100 may be an area in which the second electrode CE and a second power supplying line (see '120' in FIG. 12) contact each other. The electrode contact area 100 may be disposed in the non-display area NDA. The electrode contact area 100 may be disposed at one side of the non-display area NDA surrounding the display area DA. For example, the electrode contact area 100 may be disposed under the display area DA. In this case, a lower portion of the display area DA may be a portion of the non-display area NDA corresponding to an area in which the pad area PDA is disposed. The electrode contact area 100 may be disposed between the display area DA and the pad area PDA. For example, the electrode contact area 100 may be disposed between signal lines connecting the pad area PDA to the display area DA. In addition, the electrode contact area 100 may be provided in plural near opposite sides of the pad area PDA. For example, a first electrode contact area may be provided at a first side of the pad area PDA and a second electrode contact area may be provided at a second side of the pad area PDA opposite the first side.

The electrode contact area 100 may not overlap the crack sensing line CSL, the electrostatic protecting line EPL, and the touch sensing line TSL, in a plan view. A detailed description of the electrode contact area 100 will be described later with reference to FIG. 12 and FIG. 13.

The touch sensing line TSL may be disposed within the non-sensing area NSA. The touch sensing line TSL may be electrically connected to the sensor electrode SE to form a path through which electrical information regarding the touch input is provided. For example, the electrical information regarding the touch input may be provided from the touch sensing line TSL to pads provided in the pad area PDA. The number of the touch sensing lines TSL may be at least two or more. The touch sensing line TSL may include a first touch sensing line TSL1 and a second touch sensing line TSL2.

The second pad PAD2 may be arranged in the pad area PDA disposed in the non-sensing area NSA. A plurality of second pads PAD2 may be provided. The second pad PAD2 may be a sensor pad. The second pad PAD2 may include a first crack sensing pad CSP1, a second crack sensing pad CSP2, a third crack sensing pad CSP3, a fourth crack sensing pad CSP4, a first touch sensing pad TP1, a second touch sensing pad TP2, a third touch sensing pad TP3, a fourth touch sensing pad TP4, a first electrostatic protecting pad EP1, and a second electrostatic protecting pad EP2. The first electrostatic protecting pad EP1 and the second electrostatic protecting pad EP2 may be located at opposite ends of the second pad PAD2.

The sensor electrode SE may include a conductive pattern CP, a first bridge pattern BRP1, and a second bridge pattern BRP2. The conductive pattern CP may include a first conductive pattern CP1 and a second conductive pattern CP2.

The touch sensor TS may acquire information on a user's touch input based on information on a change in capacitance formed between the first conductive pattern CP1 and the second conductive pattern CP2.

The first conductive pattern CP1 and the second conductive pattern CP2 may include a conductive material. The conductive material may include at least one of a metal, an alloy of the metal, a conductive polymer, a conductive metal oxide, or a nano conductive material, but is not limited to a specific embodiment.

The first conductive pattern CP1 may be electrically connected to the first touch sensing line TSL1 The first touch sensing line TSL1 may include a (1_1)-th touch sensing line TSL1_1 and a (1_2)-th touch sensing line TSL1_2. One of the first conductive pattern CP1 may be electrically connected to the first touch sensing pad TP1 through the (1_1)-th touch sensing line TSL1_1. The other of the first conductive pattern CP1 may be electrically connected to the second touch sensing pad TP2 through the (1_2)-th touch sensing line TSL1_2. For example, a first conductive pattern CP1 in a first row may be connected to the first touch sensing pad TP1 through the (1_1)-th touch sensing line TSL1_1, and a first conductive pattern CP2 in a second row adjacent to the first row may be connected to the second touch sensing pad TP2 through the (1_2)-th touch sensing line TSL1_2.

The second conductive pattern CP2 may be electrically connected to the second touch sensing line TSL2. The second touch sensing line TSL2 may include a (2_1)-th touch sensing line TSL2_1 and a (2_2)-th touch sensing line TSL2_2. One of the second conductive pattern CP2 may be electrically connected to the third touch sensing pad TP3 through the (2_1)-th touch sensing line TSL2_1. The other of the second conductive pattern CP2 may be electrically connected to the fourth touch sensing pad TP4 through the (2_2)-th touch sensing line TSL2_2. For example, a second conductive pattern CP2 in a first column may be connected to the third touch sensing pad TP3 through the (2_1)-th touch sensing line TSL2_1, and a second conductive pattern CP2 in a second column adjacent to the first column may be connected to the fourth touch sensing pad TP4 through the (2_2)-th touch sensing line TSL2_2.

In FIG. 7, the first touch sensing line TSL1 and the second touch sensing line TSL2 are described as respectively including two sensing lines, but they are not limited thereto. In other words, the number of each of the first touch sensing line TSL1 and the second touch sensing line TSL2 is not limited to a specific embodiment.

The first touch sensing line TSL1 may be electrically connected to a sensor row formed by the first conductive pattern CP1. The first touch sensing line TSL1 may be bent at least one or more times in the non-sensing area NSA.

The second touch sensing line TSL2 may be electrically connected to a sensor column formed by the second conductive pattern CP2. The second touch sensing line TSL2 may be bent at least one or more times in the non-sensing area NSA.

The crack sensing line CSL may obtain information on whether a crack occurs in at least a portion of the display area DA. The crack sensing line CSL may be a path through which an electrical signal that indicates whether a crack is present in the hole area HA or an area adjacent to the hole area HA is provided. The crack sensing line CSL may obtain information on a resistance of a hole surrounding line HCD.

The crack sensing line CSL may include a first crack sensing line CSL1 and a second crack sensing line CSL2.

The first crack sensing line CSL1 may be electrically connected to the hole surrounding line HCD. The first crack sensing line CSL1 may be disposed within the non-sensing area NSA. The first crack sensing line CSL1 may surround at least a portion of the sensing area SA. The first crack sensing line CSL1 may extend into the sensing area SA to connect with the hole surrounding line HCD.

The first crack sensing line CSL1 may include a (1_1)-th crack sensing line CSL1_1 and a (1_2)-th crack sensing line CSL1_2. One end of the (1_1)-th crack sensing line CSL1_1 may be electrically connected to the first crack sensing pad CSP1, and the other end of the (1_1)-th crack sensing line CSL1_1 may be electrically connected to a first end portion 210 of the hole surrounding line HCD. One end of the (1_2)-th crack sensing line CSL1_2 may be electrically connected to the second crack sensing pad CSP2, and the other end of the (1_2)-th crack sensing line CSL1_2 may be electrically connected to a second end portion 220 of the hole surrounding line HCD.

The second crack sensing line CSL2 may be electrically connected to the hole surrounding line HCD. The second crack sensing line CSL2 may be disposed within the non-sensing area NSA. The second crack sensing line CSL2 may surround at least a portion of the sensing area SA and extend into the sensing area SA to connect with the hole surrounding line HCD.

The second crack sensing line CSL2 may include a (2_1)-th crack sensing line CSL2_1 and a (2_2)-th crack sensing line CSL2_2. One end of the (2_1)-th crack sensing line CSL2_1 may be electrically connected to the third crack sensing pad CSP3, and the other end of the (2_1)-th crack sensing line CSL2_1 may be electrically connected to the second end portion 220 of the hole surrounding line HCD. In this case, both of the (1_2)-th crack sensing line CSL1_2 and the (2_1)-th crack sensing line CSL2_1 may be electrically connected to the second end portion 220 of the hole surrounding line HCD. One end of the (2_2)-th crack sensing line CSL2_2 may be electrically connected to the fourth crack sensing pad CSP4, and the other end of the (2_2)-th crack sensing line CSL2_2 may be electrically connected to the first end portion 210 of the hole surrounding line HCD. In this case, both of the (1_1)-th crack sensing line CSL1_1 and the (2_2)-th crack sensing line CSL2_2 may be electrically connected to the first end portion 210 of the hole surrounding line HCD.

The (1_1)-th crack sensing line CSL1_1 is supplied with a voltage from the first crack sensing pad CSP1, and the (1_2)-th crack sensing line CSL1_2 is supplied with a voltage from the second crack sensing pad CSP2, so that first resistance information of the hole surrounding line HCD may be obtained.

Similarly, the (2_1)-th crack sensing line CSL2_1 is supplied with a voltage from the third crack sensing pad CSP3, and the (2_2)-th crack sensing line CSL2_2 is supplied with a voltage from the fourth crack sensing pad CSP4, so that second resistance information of the hole surrounding line HCD may be obtained.

In this case, the display device DD may further include a crack inspection part capable of obtaining information on the resistance of the hole surrounding line HCD. The crack inspection part may determine whether a crack occurs in an area adjacent to the hole area HA based on the first resistance information and the second resistance information. For example, the crack inspection part may determine that a crack occurs in the area adjacent to the hole area HA when one of a resistance value of the hole surrounding line HCD according to the first resistance information and a resistance value of the hole surrounding line HCD according to the second resistance information is different from a predetermined resistance value for the hole surrounding line HCD.

The electrostatic protecting line EPL may be provided in a form of an open loop. The electrostatic protecting line EPL may surround the display area DA. The electrostatic protecting line EPL may surround the touch sensing line TSL and/or the crack sensing line CSL. A distance between the electrostatic protecting line EPL and the display area DA may be larger than a distance between the crack sensing line CSL and the display area DA. One end of the electrostatic protecting line EPL may be electrically connected to the first electrostatic protecting pad EP1, and the other end of the electrostatic protecting line EPL may be electrically connected to the second electrostatic protecting pad EP2. The electrostatic protecting line EPL may protect the sensor electrode SE, the touch sensing line TSL, and the crack sensing line CSL from static electricity.

Figure 8:
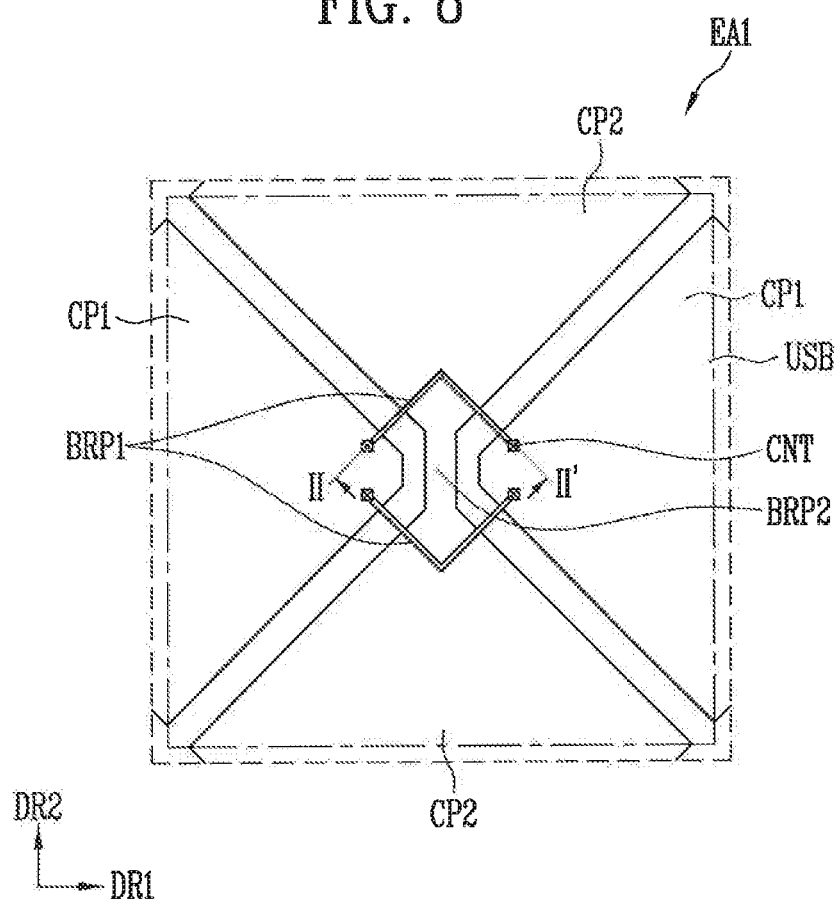
FIG. 8 illustrates an enlarged top plan view of an area EA1 of FIG. 7.

FIG. 8 illustrates an enlarged top plan view of an area EA1 of FIG. 7.

Referring to FIG. 8, the first bridge pattern BRP1 may electrically connect first conductive patterns CP1 that are adjacent to each other. The second bridge pattern BRP2 may electrically connect second conductive patterns CP2 that are adjacent to each other. In some embodiments of the present disclosure, the first bridge pattern BRP1 may be integrally formed with the first conductive pattern CP1. Similarly, the second bridge pattern BRP2 may be integrally formed with the second conductive pattern CP2.

The touch sensor TS may have a structure in which unit sensor blocks USB are repeatedly arranged. The unit sensor block USB may be a virtual unit block having a predetermined area including at least a portion of the first conductive pattern CP1 adjacent thereto and at least a portion of the second conductive pattern CP2 adjacent thereto. The unit sensor block USB may correspond to a minimum repeating unit of the arrangement pattern of the first conductive pattern CP1 and the second conductive pattern CP2.

Figure 9:
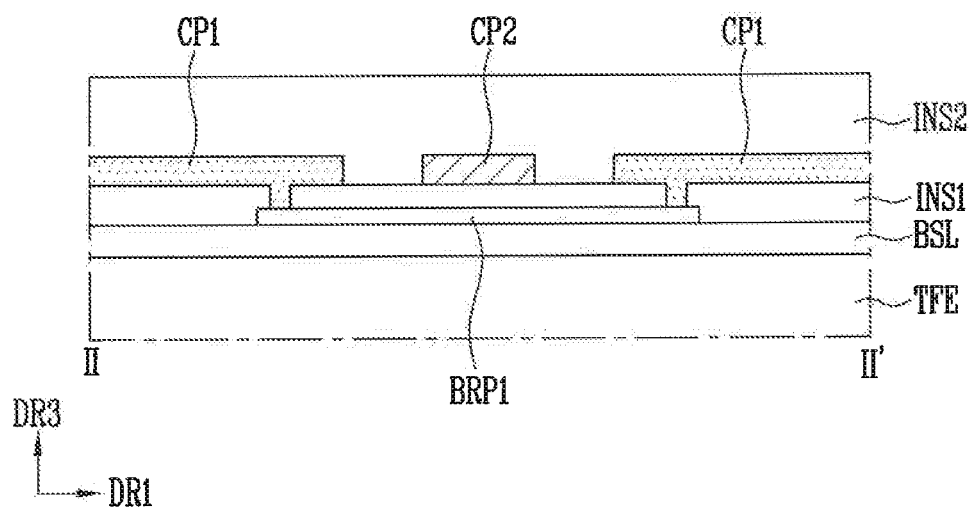
FIG. 9 illustrates a cross-sectional view taken along line II-II' of FIG. 8.

FIG. 9 illustrates a cross-sectional view taken along line II-II' of FIG. 8.

Referring to FIG. 9, the first bridge pattern BRP1 may be arranged on the base layer BSL. The first insulating layer INS1 may be disposed on the first bridge pattern BRP1. The first insulating layer INS1 may include substantially the same material as the base layer BSL, but is not limited thereto.

The first conductive pattern CP1 may be electrically connected to the first bridge pattern BRP1 through a contact hole formed in the first insulating layer INS1. The second conductive pattern CP2 may be connected to the adjacent second conductive pattern CP2 through the second bridge pattern BRP2 integrally provided with the second conductive pattern CP2.

The structures of the first conductive pattern CP1, the second conductive pattern CP2, the first bridge pattern BRP1, and the second bridge pattern BRP2 are not limited to the above-described embodiment. In some embodiments of the present disclosure, the first and second conductive patterns CP1 and CP2 and the second bridge pattern BRP2 may be included in the first conductive pattern CP1, and the first bridge pattern BRP1 may be included in the second conductive pattern CP2.

Figure 10:
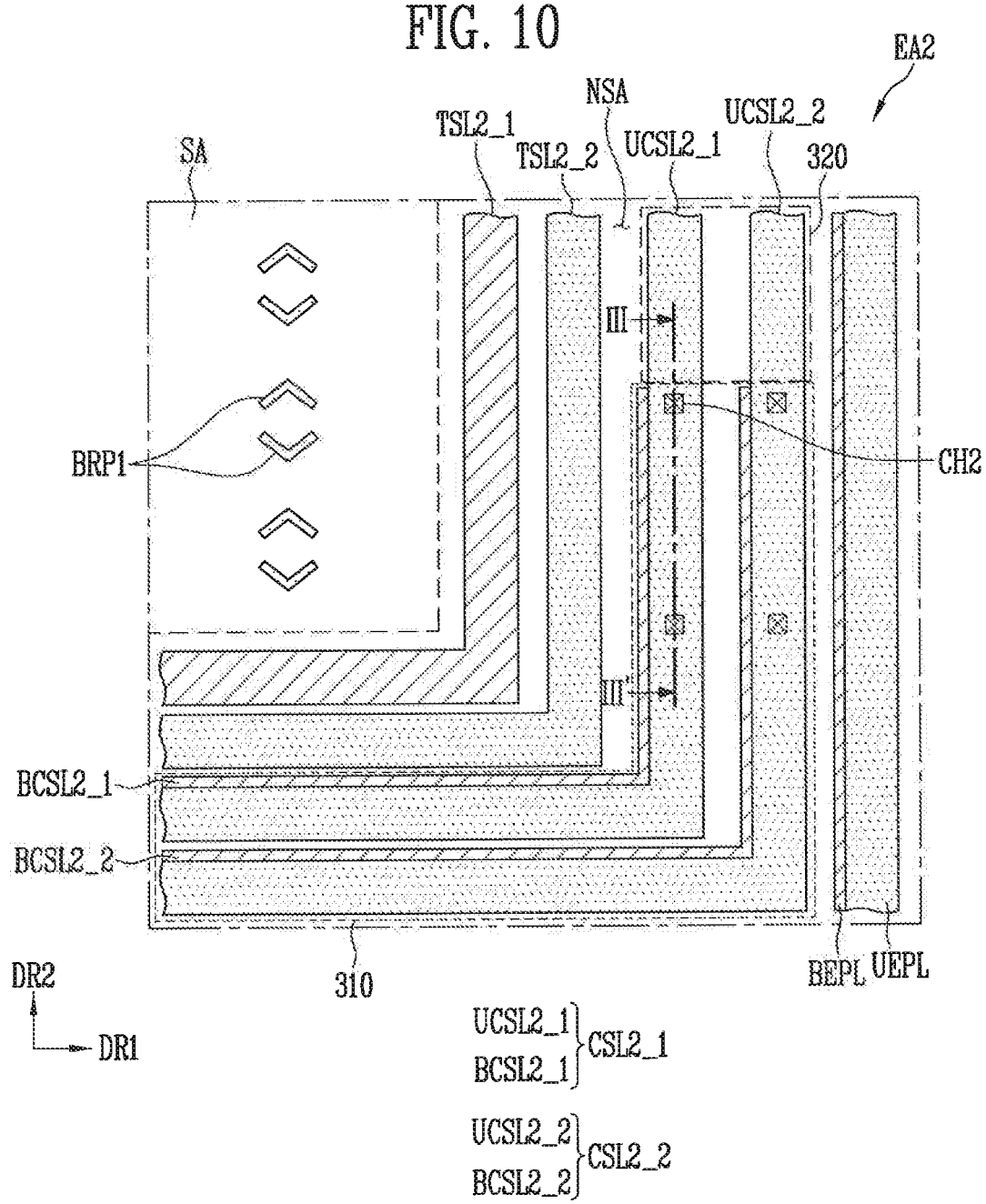
FIG. 10 illustrates an enlarged top plan view of an area EA2 of FIG. 7.

FIG. 10 illustrates an enlarged top plan view of an area EA2 of FIG. 7. FIG. 10 schematically illustrates the non-sensing area NSA according to the present embodiment. In FIG. 10, a portion of the non-sensing area NSA positioned on a side surface of the sensing area SA is described, and in this case, the second touch sensing line TSL2 and the second crack sensing line CSL2 are mainly described. In FIG. 10, the first conductive pattern CP1, the second conductive pattern CP2, and the second bridge pattern BRP2 that are disposed in the sensing area SA are not illustrated.

Referring to FIG. 10, the second touch sensing line TSL2 may be implemented as a plurality of layers. For example, the second touch sensing line TSL2 may include the (2_1)-th touch sensing line TSL2_1 and the (2_2)-th touch sensing line TSL2_2 that are arranged on different layers, respectively. The (2_1)-th touch sensing line TSL2_1 may form a first layer (see '330' in FIG. 11) of the second touch sensing line TSL2. The (2_2)-th touch sensing line TSL2_2 may form a second layer (see '340' in FIG. 11) of the second touch sensing line TSL2.

At least a portion of the second crack sensing line CSL2 may be configured as a double layer. The second crack sensing line CSL2 may include a multi-layered area 310 and a single-layered area 320.

For example, the second crack sensing line CSL2 may include the (2_1)-th crack sensing line CSL2_1 and the (2_2)-th crack sensing line CSL2_2. In this case, the (2_1)-th crack sensing line CSL2_1 may include a (2_1)-th upper crack UCSL2_1 line UCSL2_1 forming the second layer 340 and a (2_1)-th lower crack sensing line BCSL2_1 forming the first layer 330. The (2_1)-th upper crack sensing line UCSL2_1 may be respectively disposed within the multi-layered area 310 and the single-layered area 320, and the (2_1)-th lower crack sensing line BCSL2_1 may be disposed within the multi-layered area 310 but not within the single-layered area 320. Similarly, the (2_2)-th crack sensing line CSL2_2 may include a (2_2)-th upper crack UCSL2_2 line UCSL2_1 forming the second layer 340 and a (2_2)-th lower crack sensing line BCSL2_2 forming the first layer 330. The (2_2)-th upper crack sensing line UCSL2_2 may be respectively disposed within the multi-layered area 310 and the single-layered area 320, and the (2_2)-th lower crack sensing line BCSL2_2 may be disposed within the multi-layered area 310, but not within the single-layered area 320.

However, the area EA2 is not limited to the above-described example, and in some embodiments, the first layer 330 of the second crack sensing line CSL2 may be disposed within the multi-layered area 310 and the single-layered area 320. For example, the (2_1)-th upper crack sensing line UCSL2_1 and the (2_2)-th upper crack sensing line UCSL2_2 are disposed within the multi-layered area 310 without being disposed within the single-layered area 320, and the (2_1)-th lower crack sensing line BCSL2_1 and the (2_2)-th lower crack sensing line BCSL2_2 may be disposed within the multi-layered area 310 and the single-layered area 320.

The electrostatic protecting line EPL may be configured as a double layer. The electrostatic protecting line EPL may include a lower electrostatic protecting line BEPL and an upper electrostatic protecting line UEPL, wherein the upper electrostatic protecting line UEPL is spaced apart from the substrate SUB and closer to an edge of the substrate SUB than the lower electrostatic protecting line BEPL.

Figure 11:
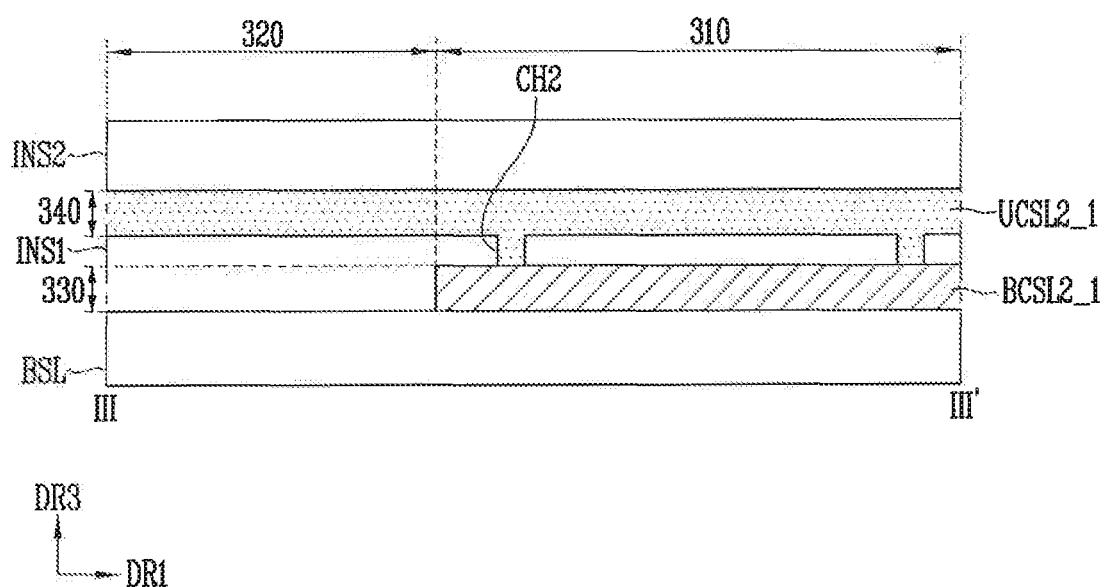
FIG. 11 illustrates a cross-sectional view taken along line III-III' of FIG. 10.

FIG. 11 illustrates a cross-sectional view taken along line III-III' of FIG. 10. In FIG. 11, a connection relationship between the first layer 330 and the second layer 340 will be described based on the (2_1)-th crack sensing line CSL2_1. However, a technical characteristic of the (2_1)-th crack sensing line CSL2_1 described in FIG. 11 may be applied to the (2_2) crack sensing line CSL2_2.

Referring to FIG. 11, the first layer 330 may be a layer disposed adjacent to the base layer BSL compared to the second layer 340. A wire arranged in the first layer 330 and a wire arranged in the second layer 340 may be connected through a second contact hole CH2 formed in the first insulating layer INS1 interposed between the first layer 330 and the second layer 340.

In the multi-layered area 310, the (2_1)-th lower crack sensing line BCSL2_1 may be disposed in the first layer 330. The second contact hole CH2 may be formed in the first insulating layer INS1 within the multi-layered area 310, and the (2_1)-th lower crack sensing line BCSL2_1 may be connected to the (2_1) upper crack sensing line UCSL2_1 through the second contact hole CH2. A plurality of connection points may be provided for the (2_1)-th lower crack sensing line BCSL2_1 and the (2_1) upper crack sensing line UCSL2_1 in the multi-layered area 310.

In the single-layered area 320, the (2_1)-th lower crack sensing line BCSL2_1 may not be provided. In the single-layered area 320, the first insulating layer INS1 may be disposed on the base layer BSL, and the (2_1)-th upper crack sensing line UCSL2_1 may be disposed on the first insulating layer INS1.

Figure 12:
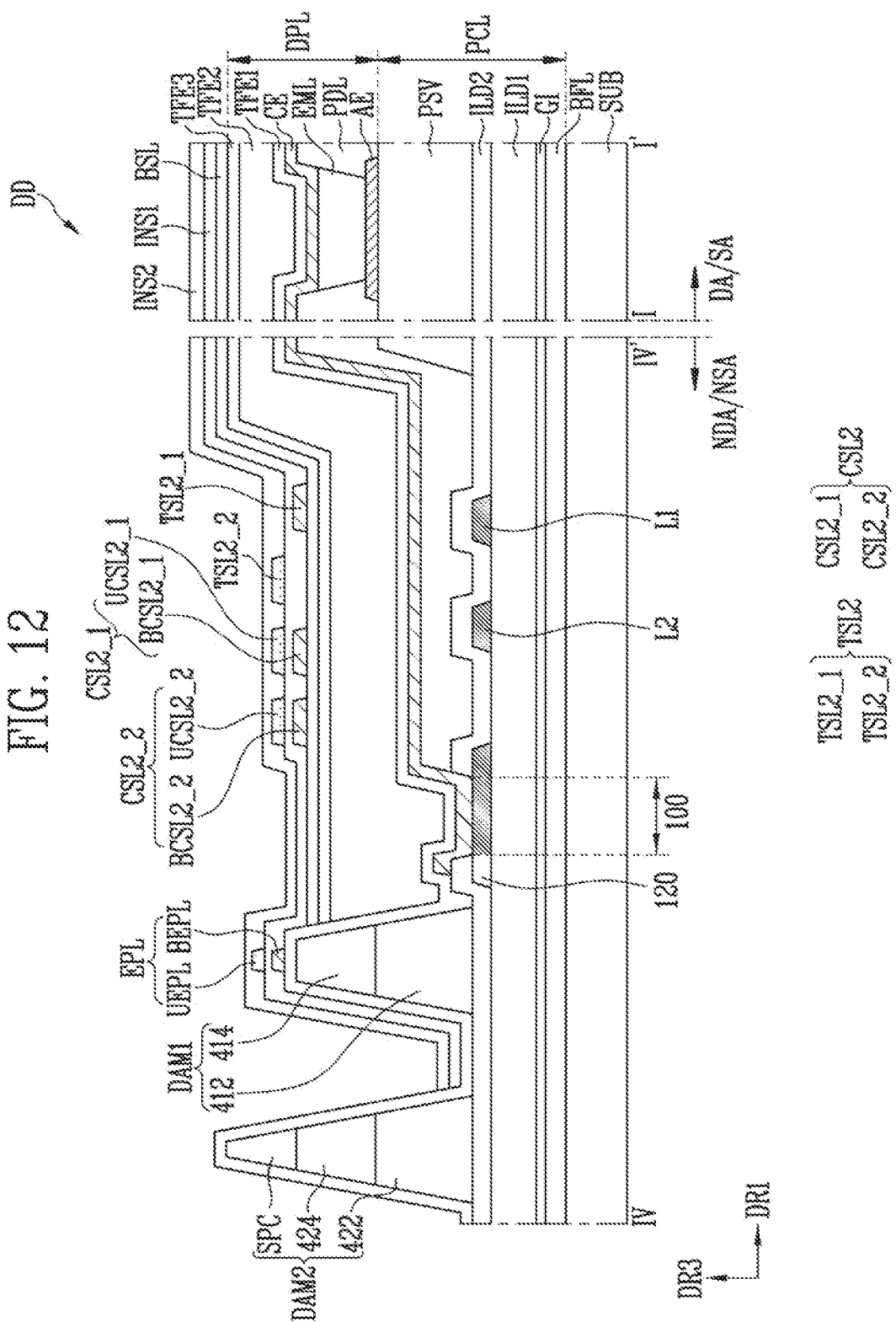
FIG. 12 and FIG. 13 illustrate schematic cross-sectional views of a display device according to the embodiment, corresponding to a cross-sectional view taken along line I-I' of FIG. 3 and a cross-sectional view taken along line IV-IV' of FIG. 7, respectively.
Figure 13:
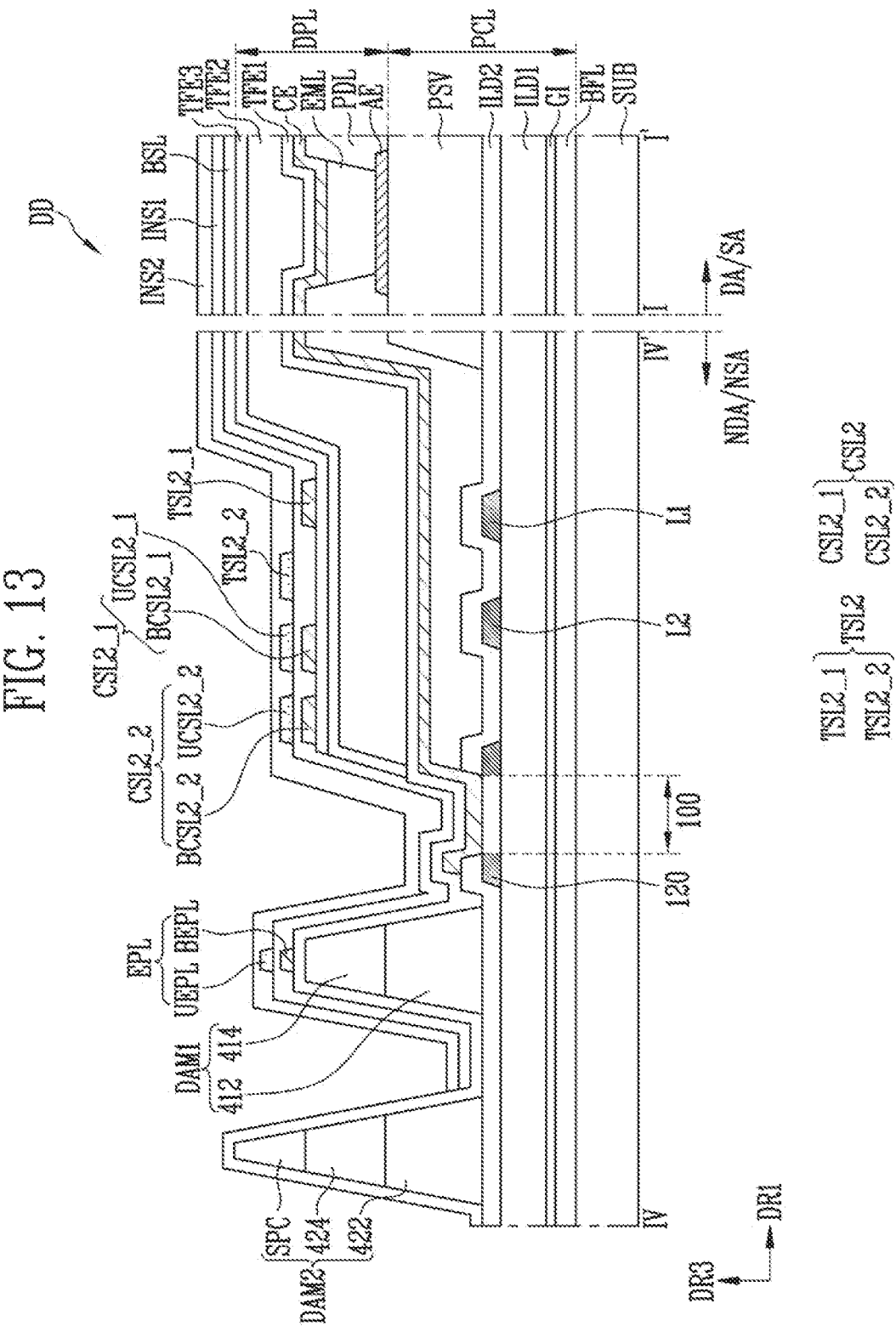

Hereinafter, a structure including the electrode contact area 100 according to an embodiment of the present disclosure will be described in detail with reference to FIG. 12 and FIG. 13. FIG. 12 and FIG. 13 illustrate schematic cross-sectional views of a display device according to the embodiment, corresponding to a cross-sectional view taken along line of FIG. 3 and a cross-sectional view taken along line IV-IV' of FIG. 7.

First, referring to FIG. 12, the display device DD according to the present embodiment may include the display area DA, the sensing area SA, the non-display area NDA, and the non-sensing area NSA. In this case, the display area DA and the sensing area SA may correspond to each other, and the non-display area NDA and the non-sensing area NSA may correspond to each other. For example, the non-display area NDA and the non-sensing area NSA may overlap, and the display area DA and the sensing area SA may overlap.

In the display area DA, the pixel circuit part PCL disposed on the substrate SUB, the display element part DPL disposed on the pixel circuit part PCL, and the first to third thin film encapsulation films TFE1 to TFE3 may be provided. Since the description of the circuit constituent elements (for example, the first to seventh transistors T1 to T7, etc.) included in the pixel circuit part PCL has been described above, these circuit constituent elements are not illustrated or described.

In the non-display area NDA, the second electrode CE, the first power supplying line, the second power supplying line 120, a first dam DAM1, a second dam DAM2, a first wire L1, a second wire L2, the electrostatic protecting line EPL, the second crack sensing line CSL2, and the second touch sensing line TSL2 may be disposed.

The second electrode CE may be formed in the display area DA and the non-display area NDA. For example, the second electrode CE may be formed in the entirety of the display area DA and the entirety of the non-display area NDA. As described above, the second electrode CE may function as a cathode electrode for the light emitting element LD. The second electrode CE may be protected from external influences by being covered by an organic film or an inorganic film. For example, at least a portion of the second electrode CE may be covered by the first thin film encapsulation film TFE1.

The second electrode CE may be electrically connected to the second power supplying line 120. The second electrode CE may be supplied with a voltage from the second power supplying line 120 to function as a cathode electrode.

The first to third thin film encapsulation films TFE1 to TFE3 may seal at least a portion of each of the display area DA and non-display area NDA.

The first thin film encapsulation film TFE1 may cover the entire surfaces of the display area DA and the non-display area NDA. The first thin film encapsulation film TFE1 may at least cover the second electrode CE to protect the second electrode CE from external influences. The first thin film encapsulation film TFE1 may cover both the first dam DAM1 and the second dam DAM2. The first thin film encapsulation film TFE1 may be disposed on a (1_1)-th dam layer 412, a (1_2)-th dam layer 414, a (2_1)-th dam layer 422, and a (2_2)-th dam layer 424.

The second thin film encapsulation film TFE2 is disposed on the first thin film encapsulation film TFE1, but may not be disposed between the first dam DAM1 and the second dam DAM2. When an organic material (or inorganic material) is provided to form the second thin film encapsulation film TFE2, the movement of the second thin film encapsulation film TFE2 is blocked by the first dam DAM1, and thus it is possible to prevent the second thin film encapsulation film TFE2 from being provided at an edge of the substrate SUB. In other words, the second thin film encapsulation film TFE2 may not flow beyond the first dam DAM1.

A thickness of the second thin film encapsulation film TFE2 may be thicker than that of the first thin film encapsulation film TFE1 and/or that of the third thin film encapsulation film TFE3. For example, the first thin film encapsulation film TFE1 may have a first thickness, and the second thin film encapsulation film TFE2 may have a second thickness having a value larger than the first thickness. The second thin film encapsulation film TFE2 is provided in a larger amount than the first thin film encapsulation film TFE1 and the third thin film encapsulation film TFE3, so that it is possible to reduce external influences.

The third thin film encapsulation film TFE3 may be disposed on the second thin film encapsulation film TFE2. The third thin film encapsulation film TFE3 may not be disposed between the first dam DAM1 and the second dam DAM2 like the second thin film encapsulation film TFE2.

The first power supplying line and the second power supplying line 120 may be disposed in the non-display area NDA. In the present embodiment, the second power supplying line 120 is arranged in the non-display area NDA disposed at a lower side of the display area DA (for example, corresponding to an area in which the pad area PDA is disposed), but is not limited thereto. In other words, the first power supplying line and the second power supplying line 120 may be disposed in the non-display area NDA adjacent to the display area DA; however, the first power supplying line and the second power supplying line 120 are not limited to a specific position.

The first power supplying line may be the first power source ELVDD described above with reference to FIG. 4, and the second power supplying line 120 may be the second power source ELVSS described above with reference to FIG. 4. The first power supplying line may supply a driving voltage to the light emitting element LD, and the second power supplying line 120 may supply a common voltage to the light emitting element LD.

The second power supplying line 120 may be electrically connected to the second electrode CE in the electrode contact area 100. The second power supplying line 120 and the second electrode CE may contact each other within the electrode contact area 100. The second power supplying line 120 may provide the second power source ELVSS to the second electrode CE within the electrode contact area 100.

Alternatively, the second interlayer insulating film ILD2 may be interposed between the second electrode CE and the second power supplying line 120. Accordingly, the second electrode CE and the second interlayer insulating film ILD2 may be connected to each other through a contact hole formed in the second interlayer insulating film ILD2 within the electrode contact area 100.

The crack sensing line CSL, the electrostatic protecting line EPL, and the touch sensing line TSL may not be disposed in the electrode contact area 100.

For example, the electrode contact area 100 may not overlap the electrostatic protecting line EPL. The electrode contact area 100 may be spaced apart from the electrostatic protecting line EPL in the first direction DR1 and the third direction DR3. The electrode contact area 100 may not overlap the first dam DAM1 and/or the second dam DAM2 in a plan view. In addition, the electrode contact area 100 may not overlap the second crack sensing line CSL2. In other words, a connection point of the second power supplying line 120 and the second electrode CE may not be overlapped by the electrostatic protecting line EPL and the second crack sensing line CSL2. In addition, the electrode contact area 100 may not overlap the first crack sensing line CSL1.

The electrode contact area 100 may be disposed between the electrostatic protecting line EPL and the second crack sensing line CSL2 in a plan view. In a plan view, the electrode contact area 100 may be disposed in an area away from the second touch sensing line TSL2. The electrode contact area 100 may be disposed between the first dam DAM1 and the second touch sensing line TSL2 in a plan view.

The electrode contact area 100 does not overlap the electrostatic protecting line EPL, the second crack sensing line CSL2, and the second touch sensing line TSL2, so that short circuit defects that may occur in the second electrode CE or the second power supplying line 120 may be prevented. For example, in the case in which the second crack sensing line CSL2 is disposed within the electrode contact area 100, when a crack occurs in an insulating film (for example, the first thin film encapsulation film TFE1) disposed between the second electrode CE or second power supplying line 120 and the second crack sensing line CSL2 during the manufacturing process, a short circuit defect may occur between the second crack sensing line CSL2 and the second electrode CE or second power supplying line 120, but according to present the embodiment, such a short circuit defect may be prevented.

The first wire L1 and the second wire L2 may be paths through which an electrical signal provided to the light emitting element LD may flow. The first wire L1 and the second wire L2 may be disposed on the first interlayer insulating film ILD1. In this case, the first wire L1 and the second wire L2 may be formed in the same process as the second power supplying line 120. However, the positions of the first wire L1 and the second wire L2 are not limited to the above-described example. For example, one of the first wire L1 and the second wire L2 may be disposed on the gate insulating film GI.

The first dam DAM1 and the second dam DAM2 may surround at least a portion of the display area DA. The first dam DAM1 and the second dam DAM2 may have a protruding shape along the third direction DR3. The first dam DAM1 and the second dam DAM2 may be spaced apart from each other. The first dam DAM1 and the second dam DAM2 may prevent a predetermined insulating film included in the display device DD from being moved to an area other than a position to be desired. For example, when the second thin film encapsulation film TFE2 is formed, the first dam DAM1 and the second dam DAM2 may prevent a material (or substance) configuring the second thin film encapsulation film TFE2 from moving in an edge direction of the substrate SUB. Two dam structures (e.g., the first and second dams DAM1 and DAM2) that are formed in the non-display area NDA in FIG. 12 have been described as a reference, but the number of dam structures is not limited thereto.

The first dam DAM1 may include the (1_1) dam layer 412 and the (1_2) dam layer 414. The second dam DAM2 may include the (2_1)-th dam layer 422, the (2_2)-th dam layer 424, and a spacer SPC. In this case, the (1_1)-th dam layer 412 and the (2_1)-th dam layer 422 may be formed in the same process as the passivation film PSV, and may include the same material. The (1_2)-th dam layer 414 and the (2_2)-th dam layer 424 may be formed in the same process as the pixel defining layer PDL, and may include the same material.

Unlike the first dam DAM1, the second dam DAM2 may further include the spacer SPC. The spacer SPC is disposed on the (2_2)-th dam layer 424, so that a height of the second dam DAM2 may be larger than that of the first dam DAM1. Accordingly, the second dam DAM2 may further prevent an organic material (or an inorganic material) that is not blocked from moving by the first dam DAM1 from being directed to the outside of the substrate SUB.

The second touch sensing line TSL2 may include, as described above with reference to FIG. 10, the (2_1)-th touch sensing line TSL2_1 disposed on the base layer BSL to form the lower layer, and the (2_2)-th touch sensing line TSL2_2 disposed on the first insulating layer INS1 to form the upper layer.

The second touch sensing line TSL2 may not overlap the electrode contact area 100. The second touch sensing line TSL2 may be disposed between the second crack sensing line CSL2 and the display area DA in a plan view. The second touch sensing line TSL2 may be disposed between the electrode contact area 100 and the display area DA in a plan view.

The second crack sensing line CSL2 may include, as described above with reference to FIG. 10, the (2_1)-th crack sensing line CSL2_1 and the (2_2)-th crack sensing line CSL2_2 that are respectively formed of a plurality of layers. In this case, the (2_1) lower crack sensing line BCSL2_1 and the (2_2)-the lower crack sensing line BCSL2_2 forming the lower layer may be disposed on the base layer BSL. In addition, the (2_1)-th upper crack sensing line UCSL2_1 and the (2_2) upper crack sensing line UCSL2_2 forming the upper layer may be disposed on the first insulating layer INS1.

The second crack sensing line CSL2 may not overlap the electrode contact area 100. The second crack sensing line CSL2 may be disposed between the electrode contact area 100 and the second touch sensing line TSL2 in a plan view. The second crack sensing line CSL2 may be disposed between the electrostatic protecting line EPL and the second touch sensing line TSL2 in a plan view.

The electrostatic protecting line EPL may be disposed on the first dam DAM1. The lower electrostatic protecting line BEPL forming the lower layer of the electrostatic protecting line EPL may be disposed on the first thin film encapsulation film TFE1. The first insulating layer INS1 may be disposed on the first thin film encapsulation film TFE1, and the upper electrostatic protecting line UEPL forming the upper layer of the electrostatic protecting line EPL may be disposed on the first insulating layer INS1.

The electrostatic protecting line EPL may be disposed on the first dam DAM1 to be spaced apart from other electrode configurations (for example, the second power supplying line 120), thereby preventing short circuit defects with the other electrode configurations. In addition, the electrostatic protecting line EPL is disposed on the first dam DAM1, but the first dam DAM1 does not overlap the electrode contact area 100. Therefore, a short circuit defect between the second power supplying line 120 and the second electrode CE may be further prevented.

An embodiment of the present disclosure provides a display device DD including: a substrate SUB including a display area DA and a non-display area NDA; a crack sensing line CSL disposed in the non-display area NDA; an electrostatic protecting line EPL disposed in the non-display area NDA; a light emitting element LD disposed on the substrate SUB and including a first electrode AE, a second electrode CE disposed on the first electrode AE, and an emission layer EML disposed between the first electrode AE and the second electrode CE; and a power supplying line 120, wherein the second electrode CE and the power supplying line 120 are in contact in an electrode contact area 100, the electrode contact area 100 being disposed in the non-display area NDA, and the crack sensing line CSL and the electrostatic protecting line EPL do not overlap the electrode contact area 100.

Hereinafter, a cross-sectional structure of a display device DD according to another embodiment of the present disclosure will be described with reference to FIG. 13. However, descriptions of technical contents that may duplicate with the above-described contents will be omitted, and contents different from those described above with reference to FIG. 12 will be mainly described.

The display device DD of FIG. 13 is different from the display device DD of FIG. 12 in that the second thin film encapsulation film TFE2 and the third thin film encapsulation film TFE3 do not overlap the electrode contact area 100.

Referring to FIG. 13, the second thin film encapsulation film TFE2 may not overlap the electrode contact area 100 in a plan view. The second thin film encapsulation film TFE2 is disposed on the first thin film encapsulation film TFE1, but may not be disposed on the first thin film encapsulation film TFE1 disposed within the electrode contact area 100. For example, an end portion of the second thin film encapsulation film TFE2 is disposed between the electrode contact area 100 and the second crack sensing line CSL2.

The third thin film encapsulation film TFE3 may not overlap the electrode contact area 100 in a plan view. The third thin film encapsulation film TFE3 may be disposed on the second thin film encapsulation film TFE2.

According to the present embodiment, when compared with the first thin film encapsulation film TFE1 and the third thin film encapsulation film TFE3, the second thin film encapsulation film TFE2 having a relatively thick thickness may not be disposed within the electrode contact area 100. In this case, if the second crack sensing line CSL2 or the electrostatic protecting line EPL overlaps the electrode contact area 100, a small amount of insulating film may be provided between the second crack sensing line CSL2 or electrostatic protecting line EPL and the second electrode CE. Accordingly, when a crack occurs in the insulating film interposed between the second crack sensing line CSL2 or electrostatic protecting line EPL and the second electrode CE, a short circuit defect may occur. However, according to the present embodiment, the electrode contact area 100 and the second crack sensing line CSL2 or electrostatic protecting line EPL may not overlap, and thus, in the display device DD of FIG. 13, even when the second thin film encapsulation film TFE2 having a thick thickness is not arranged in the electrode contact area 100, a short circuit defect may be prevented.

Embodiments of the present disclosure described above provide a display device with increased reliability for electrical signal flow by preventing short circuit defects.

What is claimed is:

1. A display device, comprising:
    a substrate including a display area and a non-display area;
    a crack sensing line disposed in the non-display area;
    an electrostatic protecting line disposed in the non-display area;
    a light emitting element disposed on the substrate and including a first electrode, a second electrode disposed on the first electrode, and an emission layer disposed between the first electrode and the second electrode; and
    a power supplying line,
    wherein the second electrode and the power supplying line are in contact in an electrode contact area, the electrode contact area being disposed in the non-display area,
    the crack sensing line and the electrostatic protecting line do not overlap the electrode contact area, and
    the electrode contact area is disposed between the crack sensing line and the electrostatic protecting line, in a plan view.

2. The display device of claim 1, wherein a distance between the electrostatic protecting line and the display area is larger than a distance between the crack sensing line and the display area.

3. The display device of claim 1, wherein the crack sensing line includes two layers in a first area, and a single layer in a second area.

4. The display device of claim 1, further comprising:
    a hole area disposed in the display area, wherein a sensor is disposed in the hole area; and
    a hole line surrounding a portion of the hole area, wherein the crack sensing line is electrically connected to the hole line.

5. The display device of claim 4, wherein the hole line includes a first end portion and a second end portion, and
    the crack sensing line includes:
    a first crack sensing line disposed on a first side of the display area and including a (1_1)-th crack sensing line for applying a voltage to the first end portion and a (1-2)-th crack sensing line for applying a voltage to the second end portion; and
    a second crack sensing line disposed on a second side of the display area and including a (2_1)-th crack sensing line for applying a voltage to the first end portion and a (2-2)-th crack sensing line for applying a voltage to the second end portion.

6. The display device of claim 1, wherein the first electrode is an anode electrode, and the second electrode is a cathode electrode.

7. The display device of claim 1, further comprising:
a first thin film encapsulation layer covering a portion of the second electrode; and
a second thin film encapsulation layer covering a portion of the first thin film encapsulation layer.

8. The display device of claim 7, wherein a portion of the first thin film encapsulation layer overlaps the electrode contact area, and the second thin film encapsulation layer does not overlap the electrode contact area.

9. The display device of claim 7, wherein the first thin film encapsulation layer has a first thickness, and the second thin film encapsulation layer has a second thickness larger than the first thickness.

10. The display device of claim 1, wherein the light emitting element is an organic light emitting diode or a nano-scale light emitting diode.

11. A display device, comprising:
a substrate including a display area and a non-display area,
a crack sensing line disposed in the non-display area:
an electrostatic protecting line disposed in the non-display area;
a light emitting element disposed on the substrate and including a first electrode, a second electrode disposed on the first electrode, and an emission layer disposed between the first electrode and the second electrode;
a power supplying line,
a sensor electrode disposed in the display area; and
a touch sensing line disposed in the non-display area and connected to the sensor electrode,
wherein the second electrode and the power supplying line are in contact in an electrode contact area, the electrode contact area being disposed in the non-display area,
the crack sensing line and the electrostatic protecting line do not overlap the electrode contact area, and
the touch sensing line does not overlap the electrode contact area.

12. A display device, comprising:
a substrate including a display area and a non-display area;
a crack sensing line disposed in the non-display area;
an electrostatic protecting line disposed in the non-display area;
a light emitting element disposed on the substrate and including a first electrode, a second electrode disposed on the first electrode, and an emission layer disposed between the first electrode and the second electrode;
a power supplying line; and
a first dam protruding in a display direction of the light emitting element and surrounding a portion of the display area,
wherein the second electrode and the power supplying line are in contact in an electrode contact area, the electrode contact area being disposed in the non-display area,
the crack sensing line and the electrostatic protecting line do not overlap the electrode contact area, and
the electrostatic protecting line is arranged on the first dam.

13. The display device of claim 12, wherein the electrostatic protecting line includes a first electrostatic protecting line and a second electrostatic protecting line, and
the first electrostatic protecting line and the second electrostatic protecting line overlap each other with an insulating film interposed therebetween.

14. The display device of claim 12, further comprising:
a second dam protruding in the display direction of the light emitting element and surrounding the portion of the display area,
wherein the first dam is disposed between the display area and the second dam, and
a height of the second dam is larger than a height of the first dam.

15. A display device, comprising:
a substrate including a display area and a non-display area;
a crack sensing line disposed in the non-display area;
an electrostatic protecting line disposed in the non-display area;
a light emitting element disposed on the substrate and including a first electrode, a second electrode disposed on the first electrode, and an emission layer disposed between the first electrode and the second electrode;
a power supplying line;
a first thin film encapsulation layer covering a portion of the second electrode;
a second thin film encapsulation layer coven ng a portion of the first thin film encapsulation layer; and
a first dam protruding in a display direction of the light emitting element and surrounding a portion of the display area,
wherein the second electrode and the power supplying line are in contact in an electrode contact area, the electrode contact area being disposed in the non-display area,
the crack sensing line and the electrostatic protecting line do not overlap the electrode contact area, and
the second thin film encapsulation layer is disposed in an area surrounded by the first dam, and overlaps the electrode contact area.

16. The display device of claim 15, wherein each of the first thin film encapsulation layer and the second thin film encapsulation layer at least partially overlaps the electrode contact area.

17. A display device, comprising:
a substrate including a display area and a non-display area;
a light emitting element disposed in the display area, wherein the light emitting element includes an electrode in the non-display area;
an electrostatic protecting line and a crack sensing line disposed in the non-display area; and
a power supply line disposed in the non-display area between the electrostatic protecting line and the crack sensing line, wherein the electrode of the light emitting element is connected to the power supply line, and the crack sensing line includes two layers in a first area, and a single layer in a second area.

18. The display device of claim 17, wherein the electrostatic protecting line and the crack sensing line do not overlap an area where the power supply line and the electrode of the light emitting element overlap.

19. A display device, comprising:
a substrate including a non-sensing area and a sensing area;
a light emitting element disposed in the sensing area and overlapped by a plurality of thin film encapsulation films, wherein the light emitting element includes a first electrode, an emission layer and a second electrode;
a crack sensing line disposed on the plurality of thin film encapsulation films in the non-sensing area;
an electrostatic protecting line disposed on a dam in the non-sensing area; and a power supply line disposed in the non-sensing area and connected with the light emitting element via the second electrode, wherein a connection point between the power supply line and the light emitting element is not overlapped by the light emitting element or the crack sensing line.

* * * * *